(12) United States Patent
Wischnewskiy et al.

(10) Patent No.: US 9,082,959 B2
(45) Date of Patent: Jul. 14, 2015

(54) ACTUATOR

(75) Inventors: Wladimir Wischnewskiy, Waldbronn (DE); Alexej Wischnewskij, Wörth (DE)

(73) Assignee: PHYSIK INSTRUMENTE (PI) GMBH & CO. KG, Karlsruhe (DE)

( * ) Notice: Subject to any disclaimer, the term of this patent is extended or adjusted under 35 U.S.C. 154(b) by 584 days.

(21) Appl. No.: 13/505,676

(22) PCT Filed: Oct. 27, 2010

(86) PCT No.: PCT/DE2010/001254
§ 371 (c)(1),
(2), (4) Date: May 30, 2012

(87) PCT Pub. No.: WO2011/050784
PCT Pub. Date: May 5, 2011

(65) Prior Publication Data
US 2012/0228994 A1     Sep. 13, 2012

(30) Foreign Application Priority Data

Nov. 2, 2009 (DE) .................. 10 2009 051 395

(51) Int. Cl.
*H01L 41/09*     (2006.01)
*H02N 2/00*     (2006.01)
(Continued)

(52) U.S. Cl.
CPC ............ *H01L 41/0986* (2013.01); *H02N 2/002* (2013.01); *H02N 2/008* (2013.01); *H02N 2/026* (2013.01); *H02N 2/06* (2013.01)

(58) Field of Classification Search
USPC ............. 310/323.01–323.03, 323.08, 323.16, 310/323.17, 328, 368, 369, 317, 367
See application file for complete search history.

(56) References Cited

U.S. PATENT DOCUMENTS 4,742,260 A * 5/1988 Shimizu et al. .......... 310/323.16
4,952,836 A * 8/1990 Robertson .................. 310/339
(Continued)

FOREIGN PATENT DOCUMENTS

DE    10 2004 024 656 A1    12/2005
JP          01-315278 A * 12/1989 ............ H02N 2/00
(Continued)

OTHER PUBLICATIONS

International Search Report (PCT/ISA/210) issued on Mar. 8, 2011, by the German Patent Office as the International Searching Authority for International Application No. PCT/DE2010/001254.
(Continued)

*Primary Examiner* — Thomas Dougherty
(74) *Attorney, Agent, or Firm* — Buchanan Ingersoll & Rooney PC

(57) ABSTRACT

An exemplary actuator in the form of a plate is disclosed, which includes, at least two generators for exciting an acoustic standing wave in the actuator. The actuator can have at least two main surfaces and a plane of symmetry S running perpendicularly to the main surfaces, with respect to which the generators are arranged symmetrically. A first lateral surface area can have a length L that substantially corresponds to the wavelength of the acoustic standing wave excited in the actuator. A second lateral surface area of the actuator can have a length (B) that is greater than the wavelength of the acoustic standing wave excited in the actuator, and that is not equal to a multiple of half the wavelength of the excited acoustic standing wave.

19 Claims, 27 Drawing Sheets

(51) Int. Cl.
*H02N 2/02* (2006.01)
*H02N 2/06* (2006.01)

(56) References Cited

U.S. PATENT DOCUMENTS

| | | | |
|---|---|---|---|
| 5,939,816 A * | 8/1999 | Culp | 310/328 |
| 7,157,830 B2 * | 1/2007 | Jansson et al. | 310/317 |
| 8,310,133 B2 * | 11/2012 | Brown et al. | 310/334 |
| 2002/0074901 A1 * | 6/2002 | Johansson | 310/328 |
| 2003/0178915 A1 | 9/2003 | Yoon et al. | |
| 2008/0073999 A1 | 3/2008 | Wischnewskij et al. | |
| 2008/0211348 A1 | 9/2008 | Wischnewskij et al. | |
| 2009/0009032 A1 | 1/2009 | Wischnewskij et al. | |
| 2009/0039736 A1 | 2/2009 | Matsuo | |
| 2009/0251026 A1 * | 10/2009 | Kang et al. | 310/323.16 |
| 2010/0013353 A1 | 1/2010 | Wischnewskij et al. | |
| 2011/0175489 A1 | 7/2011 | Wischnewskij et al. | |

FOREIGN PATENT DOCUMENTS

| | | |
|---|---|---|
| JP | 03-065073 A | 3/1991 |
| JP | 2007-538484 A | 12/2007 |
| JP | 2008-512073 A | 4/2008 |
| JP | 2008-520174 A | 6/2008 |
| JP | 2009-505623 A | 2/2009 |
| JP | 2011-522506 A | 7/2011 |
| WO | 2006/027301 A1 | 3/2006 |
| WO | 2006/050759 A1 | 5/2006 |

OTHER PUBLICATIONS

Office Action (Notice of Grounds of Rejection) issued on Sep. 24, 2013, by the Japanese Patent Office in corresponding Japanese Patent application No. 2012-535629, and an English Translation of the Office Action (6 pages).

* cited by examiner

ACTUATOR

The invention relates to an actuator, preferably a piezoelectric actuator, in the form of a plate, comprising at least two generators for exciting an acoustic standing wave in the actuator, whereby the actuator has at least two main surfaces and a plane of symmetry S running perpendicularly to the main surfaces, with respect to which plane of symmetry the generators are arranged symmetrically, and, arranged on a first, substantially flat lateral side area of the actuator, at least one friction element and/or at least one friction layer, which is/are provided for friction contact with an element to be driven and whereby the first lateral surface area has a length L that substantially corresponds to the wavelength of the acoustic standing wave excited in the actuator.

Such an actuator in the form of a rectangular piezoelectric plate is known from the published application DE 10 2004 024 656 A1. The acoustic standing wave excited in it propagates along the two long face sides of the actuator, because the length of the aforesaid face sides represents the resonant length for the acoustic standing wave. The deformation of the actuator of this motor takes place symmetrically to its longitudinal plane of symmetry. This means that the actuator of the motor heats up symmetrically to its longitudinal plane of symmetry due to internal friction. The side of the actuator on which no friction element is located heats up in exactly the same way as the side on which the friction element is located. For this reason, considerable energy losses occur in the actuator due to internal friction.

Moreover, when the actuator is used in a corresponding motor, external friction develops at the points at which the actuator is supported from the outside, i.e., at the attachment or mounting points. Because the actuator also still has a significant oscillation speed there, additional heat that is introduced at least partially into the actuator results here due to the aforesaid external friction.

Due to the mechanical losses caused by the internal and external friction of the actuator, the overall oscillation speed of the actuator is reduced, as is consequently the speed of movement of an element to be driven by the actuator. This results in a reduction of the degree of efficiency of a corresponding motor. At the same time, the heating of the actuator caused by the internal and external friction leads to mechanical losses, as a result of which the operational reliability of the actuator decreases.

The object of the invention is therefore to provide an actuator in which there is a considerable reduction of the internal and external friction during operation and there is accordingly less self-heating, and which therefore has an increased degree of efficiency and better operational reliability.

This object is solved by an actuator of the type mentioned at the beginning, which is further formed in such a way that a second lateral surface area of the actuator has a length B that is greater than the wavelength of the acoustic standing wave excited in the actuator and that is not equal to a multiple of half the wavelength of the excited acoustic standing wave.

The actuator is preferably controlled electrically in such a way that at least one generator is activated to oscillations with a frequency that substantially corresponds to the resonant frequency of the second mode of the longitudinal oscillation of the first lateral surface area. As a result, an acoustic wave whose length corresponds to the length L of the first lateral surface area propagates along the first lateral surface area or at its surface (resonant surface).

Because the second lateral surface area has a length B that does not correspond to any multiple of half the wavelength of the wave excited in the actuator, it is also the case that no acoustic wave propagates along the second lateral surface area or along its surface. For this frequency, the surface of the second lateral surface area consequently does not represent a resonant surface (non-resonant surface).

This means that the material points of the actuator located on the resonant surface have a greater average amplitude than do the material points located on the non-resonant surface. One resonant region in which resonance oscillations of the actuator arise can consequently virtually be identified in the case of the actuator according to the invention. A non-resonant region for the actuator is located outside this resonant region. Within the resonant region, the average oscillation amplitude of the material points is therefore greater than in the other regions of the actuator. From this it follows that the mechanical losses or the heating caused by internal friction is less in the non-resonant region than in the resonant region.

In the case of mounting or attachment of the actuator according to the invention at places or points of the non-resonant surface, reduced mechanical losses due to external friction result there due to the lower oscillation speed of the material points on this surface.

As a result of the reduction of the mechanical losses due to internal and external friction in the non-resonant regions, the overall heating of the actuator is reduced, as a result of which greater effectivity and greater operational reliability are achieved.

As a further advantage, at a given resonant length L, the actuator according to the invention has a considerably lower volume than an actuator known from the state of the art according to publication DE 10 2004 024 656 A1. This circumstance likewise reduces the mechanical losses in the actuator.

At a given excitation voltage, the reduction of the mechanical losses makes it possible to increase the oscillation speed of the friction element and consequently the speed of movement of an element to be driven by the actuator. As a result, the degree of efficiency of a corresponding motor increases.

As a result of the lower mechanical losses due to reduced internal and external friction, the active component of the electrical input impedance of the actuator is also reduced for the actuator according to the invention in proportion to the capacitive component of this impedance. This in turn reduces the charging current of the input capacity of the actuator and of the capacitive current in proportion to the active component of the current flowing through the actuator.

Both lead to lower losses in a power amplifier used for the electrical excitation of the actuator, as a result of which the heating of the transistors in the power amplifier is reduced. In the case of the actuator according to the invention, it is therefore possible, for example, to connect the generators of the acoustic wave directly to a bridge power amplifier without using an otherwise customary separating filter. This simplifies the construction of the electrical excitation device, reduces the heating of the same and increases the operational reliability of the motor.

Preferred developments of the actuator according to the invention are the object of the dependent claims.

It can be advantageous for the second lateral surface area to fulfil at least one of the following requirements:
  a) the second lateral surface area is curved at least in sections;
  b) the second lateral surface area consists of at least one concave and/or at least one convex section;
  c) the second lateral surface area is flat at least in sections;
  d) the second lateral surface area consists of two or more flat sections that are differently aligned with respect to the first lateral surface area;

e) the second lateral surface area consists of flat and curved sections.

Such developments of the actuator expand the design possibilities and allow, for example, a selective adaptation to the geometric or structural conditions in which the actuator is applied or in which the actuator is used. It is conceivable in this connection for the second lateral surface area to be developed as a single surface or as multiple surfaces. In the case of multiple-surface development, it is moreover conceivable that the second lateral surface area has a sequence of flat and curved sections.

In particular, it can hereby be advantageous for the actuator to fulfil at least one of the following requirements:
 a) seen from above, the actuator has the shape of a circle segment or an ellipse segment;
 b) seen from above, the actuator has the shape of an isosceles trapezium.

These geometric shapes are comparatively simple to manufacture.

It can furthermore be advantageous if there exists on the second lateral surface area at least one point whose distance to the point of intersection of the plane of symmetry S with the first lateral surface area substantially corresponds to half the wavelength of the wave excited in the actuator. This increases the degree of efficiency of the motor.

It can furthermore be advantageous for the friction element and/or the friction layer to satisfy at least one of the following requirements:
 a) the arrangement of the friction element and/or of the friction layer is symmetrical with regard to the plane of symmetry S;
 b) the arrangement of the friction element and/or the friction layer is along the entire first lateral surface area.

This expands the design possibilities of the actuator.

It can moreover be advantageous for the actuator to carry out oscillations in the ultrasound range during operation. This results in an expanded range of applications for the actuator.

It can likewise be advantageous for the actuator to be a single layer or multiple layers, whereby the layer/layers has/have a piezoelectric material, preferably a piezoceramic material. A single-layer construction is comparatively simple to implement. In the case of a multiple layer construction, the electrical excitation voltage can be considerably less than that in a single layer construction. As a rule, piezoceramic materials have a comparatively high (inverse) piezoelectric effect and are consequently especially effective.

The invention moreover relates to a motor with at least one actuator according to one of the preceding advantageous embodiments, whereby the motor additionally has an element to be driven and an electrical excitation device.

It can be advantageous in this connection for the motor to have four actuators, each in the form of an isosceles trapezium, whereby these are arranged such that they form a Maltese cross. It can be advantageous here if the actuators are connected to one another with the help of a connection element, whereby the connection element has, at least in sections, contact with the second lateral surface area of each actuator. It can furthermore thereby be advantageous for the connection element to have a sound-insulating material and preferably to be made of the same, whereby the sound-insulating material is preferably an oxide ceramic or is made of the same material as the actuator. This results in an especially effective and operationally reliable motor.

It can also be advantageous for the actuator of the motor to have a feedback element. In a preferred development, the output of the feedback element is connected to a filter for the first harmonic of its input voltage. This allows optimal designation of the frequency of the excitation voltage for the actuator of the motor.

It can likewise be advantageous for the electrical excitation device of the motor to fulfil at least one of the following requirements:
 a) the electrical excitation device has a changeover switch that is used to connect it to one of the generators for exciting a right-tilting or left-tilting asymmetrical standing wave in the actuator;
 b) the electrical excitation device provides a periodic, asymmetrical electrical voltage, whereby the generators are connected to each other with inverse phases;
 c) the electrical excitation device has a half-bridge or bridge power amplifier that is connected to one generator or to both generators either directly or by means of a step-up transformer;
 d) the electrical excitation device has a control generator for exciting an electrical voltage whose output is connected to the input of the power amplifier, and the control input of the control generator is connected to the output of a phase detector, whereby a measurement input of this phase detector is connected directly or by means of a filter to the output of the power amplifier and a support input is connected directly or by means of a filter of the first harmonic to the output of a feedback circuit element;
 e) the electrical excitation device has a PWM controller of the voltage supply of the power amplifier;
 f) the electrical excitation device has a digital arithmetic unit which implements in software one or two filters for the first harmonic, the phase detector, the control generator for the electrical excitation device and the PWM modulator of the PWM controller of the supply voltage of the power amplifier.

The changeover switch makes it possible to change the direction of movement of the element to be driven. By providing a half-bridge or bridge power amplifier that is connected to one generator or to both generators directly or by means of a step-up transformer, the losses in the electrical excitation device are considerably reduced. The provision of a control generator in the previously mentioned manner makes it possible to stabilise the frequency of the excitation voltage. By equipping the electrical excitation device with a PWM controller for the supply voltage of the power amplifier, it is possible to control the speed of movement of the element to be driven. The provision of a digital arithmetic unit in the manner indicated above simplifies the electrical circuit construction for the electrical excitation device.

It can moreover be advantageous for the element to be driven to have an encoder for the position or for the speed of movement of the element to be driven and for the electrical excitation device to be equipped with a digital controller for the position or the speed of movement of the element to be driven. It can furthermore be advantageous for the digital controller for the position or the speed of movement of the element to be driven to be implemented in software in the digital arithmetic unit. In this way, it is possible to control the function of the motor with precision.

Preferred further developments of the invention result from combinations of the dependent claims or portions thereof.

BRIEF DESCRIPTION OF THE DRAWINGS

Shown schematically and not to scale are.

FIGS. 1 and 2 show execution variants of motors with an actuator according to the invention. The respective motors have an actuator 1 that is executed as a piezoelectric plate with two acoustic standing wave generators 2 and that is provided with a friction element 3 (FIG. 1) or a friction layer 4 (FIG. 2). The friction element 3 or the friction layer 4 is, with the help of a spring element 6, pressed against the element 5 to be driven. The element 5 to be driven is held by two (FIG. 1) or one (FIG. 2) ball bearing(s) 7 and is supported in a movable manner. Attachment elements 9 fix the actuator 1 in place so that it is unmovable with respect to the housing 8.

Figure 1:
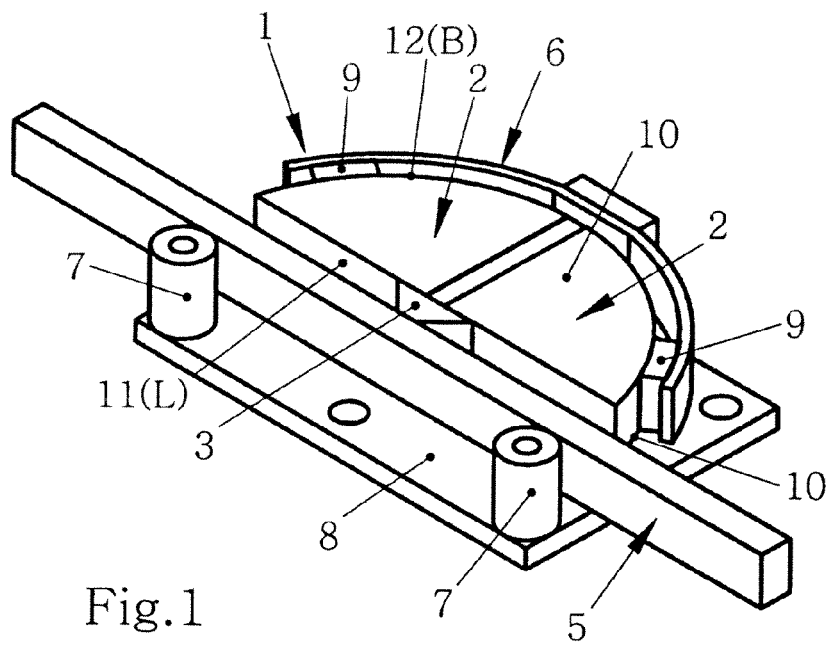
FIG. 1: a motor with an actuator according to the invention which has a friction element

The actuator 1 comprises two main surfaces 10, a first lateral surface area 11 and a second lateral surface area 12. The surface of the first lateral surface area 11 represents a resonant surface, while the surface of the second lateral surface area 12 represents a non-resonant surface. The first lateral surface area has a flat shape, i.e., the corresponding surface is flat. The length of the first lateral surface area or resonant surface is L. The second lateral surface area 12 has a curved surface, not a flat one. The length of the second lateral surface area or non-resonant surface is B. The length L of the resonant surface 11 is equal to the wavelength of the acoustic wave excited in the actuator 1. The length B of the non-resonant surface 12 is greater than the acoustic wave excited in the actuator 1 and is not equal to a multiple of half the wavelength of the excited wave.

Figure 2:
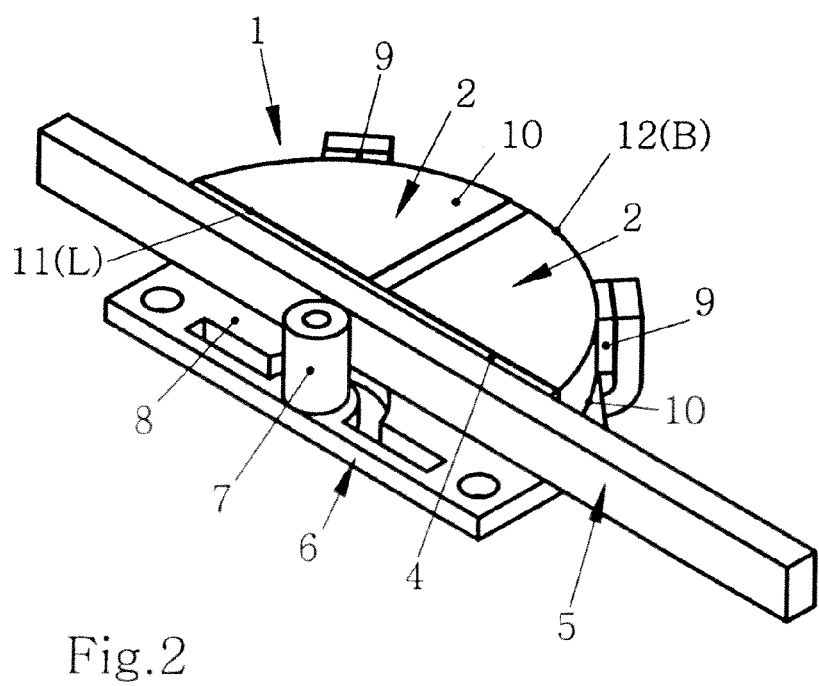
FIG. 2: a motor with an actuator according to the invention which has a friction layer

The friction element 3 (FIG. 1) and the friction layer 4 (FIG. 2) are arranged on the non-resonant surface 11 of the actuator 1, namely in each case such that it is symmetrical to the (not shown) plane of symmetry S that runs perpendicularly to the main surfaces 10. The standing wave generators 2 are likewise arranged symmetrically to the two sides of the aforesaid plane of symmetry (S).

Figure 3:
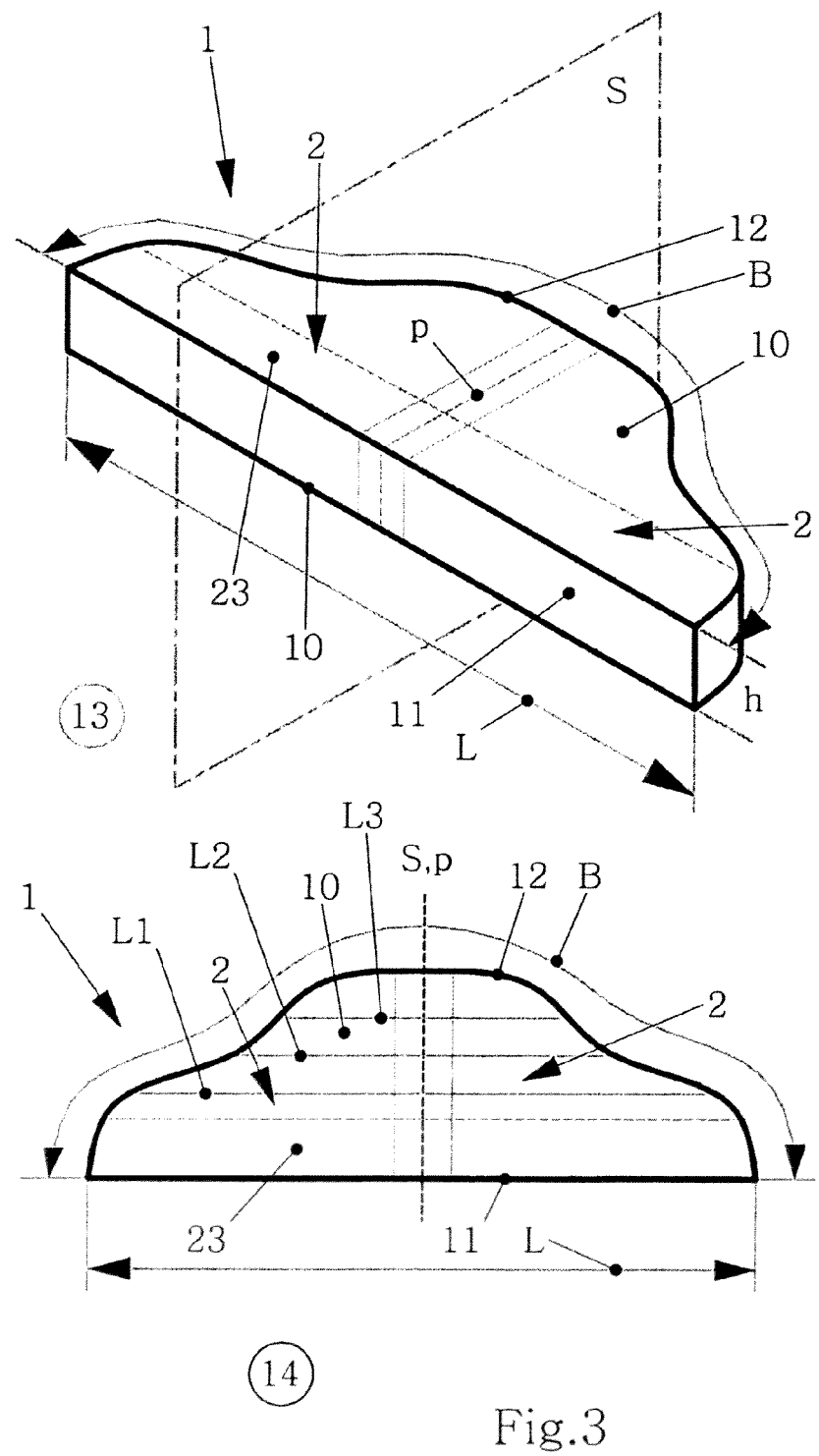
FIG. 3: an embodiment of an actuator according to the invention in a perspective view (View 13) and in a top view (View 14)

According to the embodiment of an actuator according to the invention as shown in FIG. 3, the actuator 1 changes its dimension L in the direction perpendicular to the resonant surface 11 and thereby runs through the values L1, L2, L3 . . . , as shown in View 14 of FIG. 3. The resonance of the wave excited in the actuator 1 takes place along the first lateral surface area or along the resonant surface with the length L. This resonance comprises the resonant region 23 of the actuator 1. The resonant length L and the resonant region 23 form the main resonant length and the resonant region of the actuator 1. The proposed invention provides a constructional design of the actuator 1 in which only one resonant length L and one resonant region 23 occur. The actuator 1 has a thickness h that is, e.g., 5-10 times smaller than the resonant length L. The actuator 1 is executed symmetrically to the plane S that runs through the middle of the resonant surface 11, perpendicular to said surface and perpendicular to the main surface 10. In Views 13 and 14 of FIG. 3, the line p shows the line of intersection of the plane S and the actuator 1.

Figure 4:
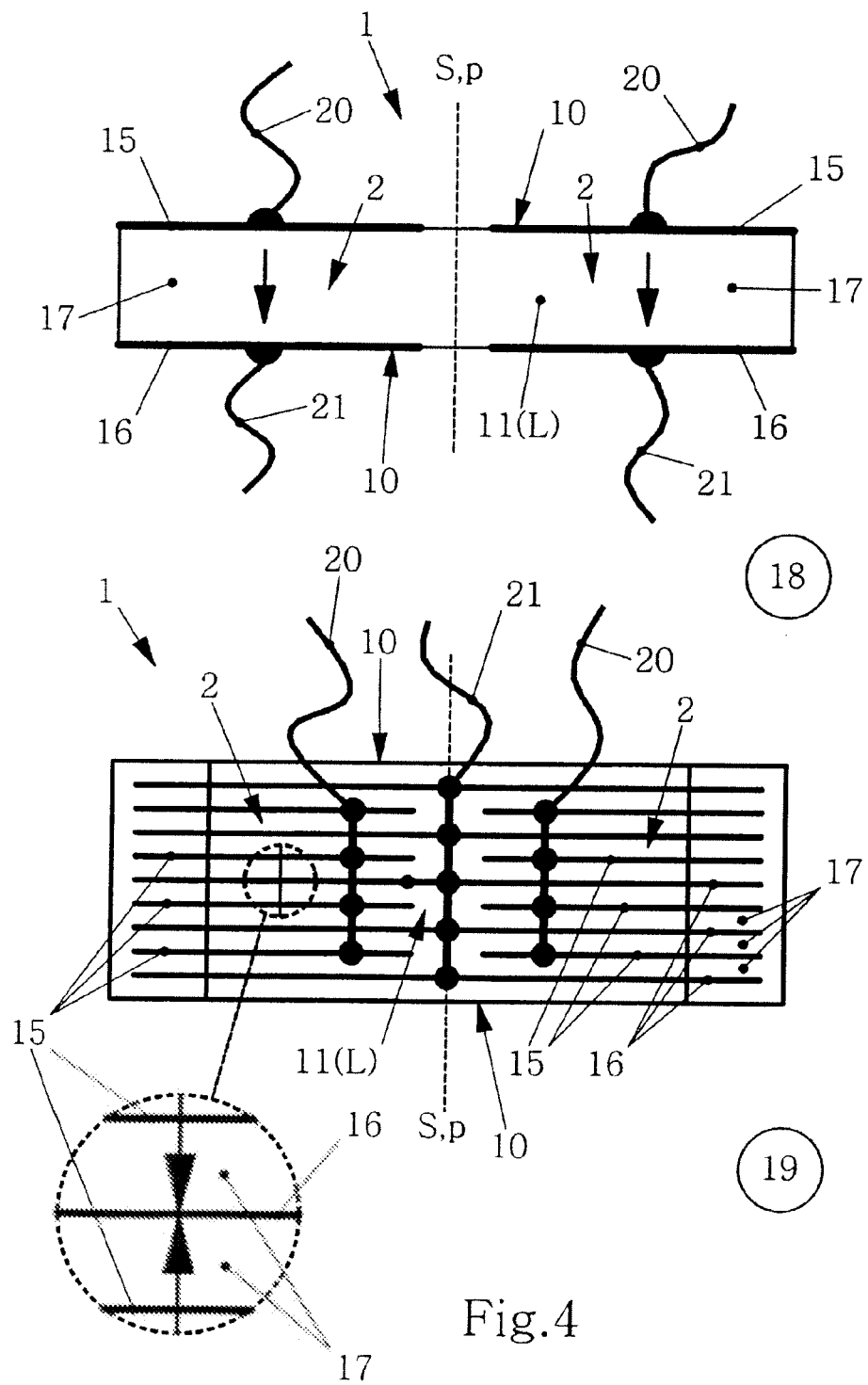
FIG. 4: View 18: a sectional view through a single-layer actuator according to the invention; View 19: a sectional view through a multiple-layer actuator according to the invention

According to View 18 of FIG. 4, each of the acoustic standing wave generators 2 can have a three-layer structure that consists of the layer of the exciting electrode 15, the layer of the general electrode 16 and the layer of the piezoelectric ceramic 17 that is between them. Each of the standing wave generators 2 can just as well have a multiple-layer structure, consisting of a multiplicity of layers 15, 16, 17 arranged in alternation, as shown in View 19 of FIG. 4. The two general electrodes 16 can hereby be combined in one general electrode. The polarisation of the piezoceramic layer 17 between the electrodes 15 and 16 runs perpendicularly to these electrodes. The arrows in FIG. 4 indicate the polarisation direction. The electrodes 15 and 16 are connected to an excitation voltage or to the corresponding electronics by means of connection points or connection lines 20 and 21.

Figure 5:
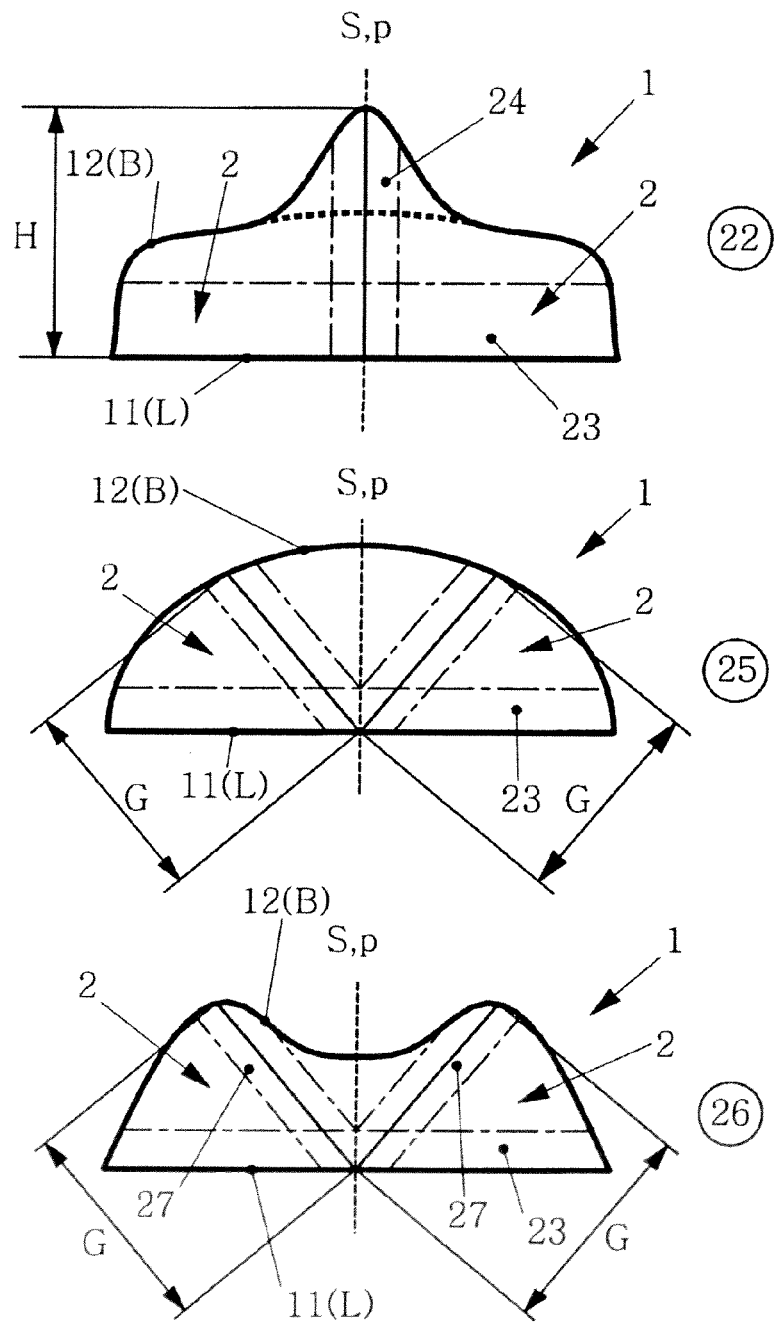
FIG. 5: Views 22, 25 and 26: Embodiments for an actuator according to the invention

According to View 22 of FIG. 5, the geometric shape of the actuator 1 can be such that the actuator has an additional resonant length H that is equal to half the wavelength of the wave excited in the actuator 1. The resonant region 24 of the actuator 1 is located in the area surrounding the length H. The length H can be equal to the height of the projecting part on the actuator 1. The actuator 1 can moreover have two additional resonant lengths G (see Views 25 and 26 of FIG. 5). The length G is hereby selected in such a way that it is equal to half the wavelength of the wave excited in the actuator. In this case, the actuator 1 has two additional resonant regions 27.

Figure 6:
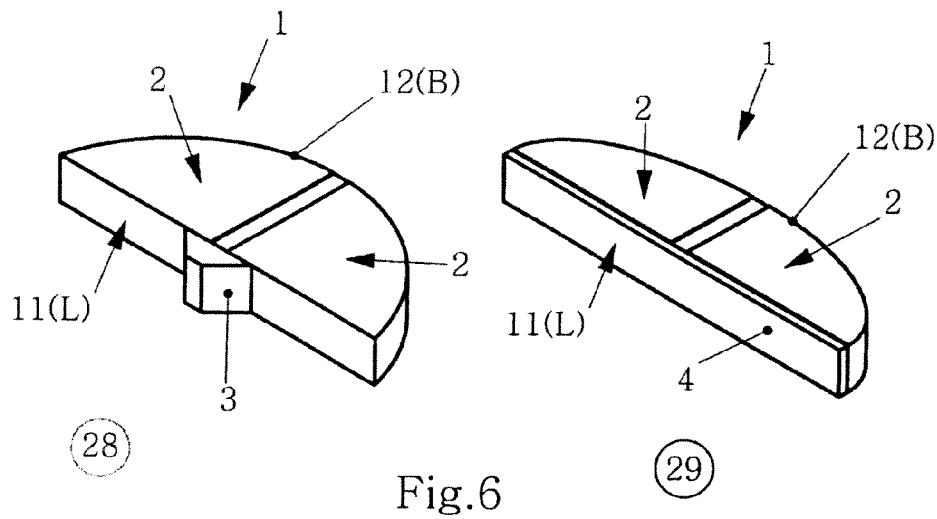
FIG. 6: Views 28 and 29: actuators according to the invention with a curved second lateral surface area

The second lateral surface area or non-resonant region 12 of the actuator 1 can have a circular or circle segment geometric shape according to View 28 of FIG. 6. According to View 29 of FIG. 6, the non-resonant surface 12 can also have an elliptical or oval shape. The resonant surface 12 can have further non-angular shapes.

Figure 7:
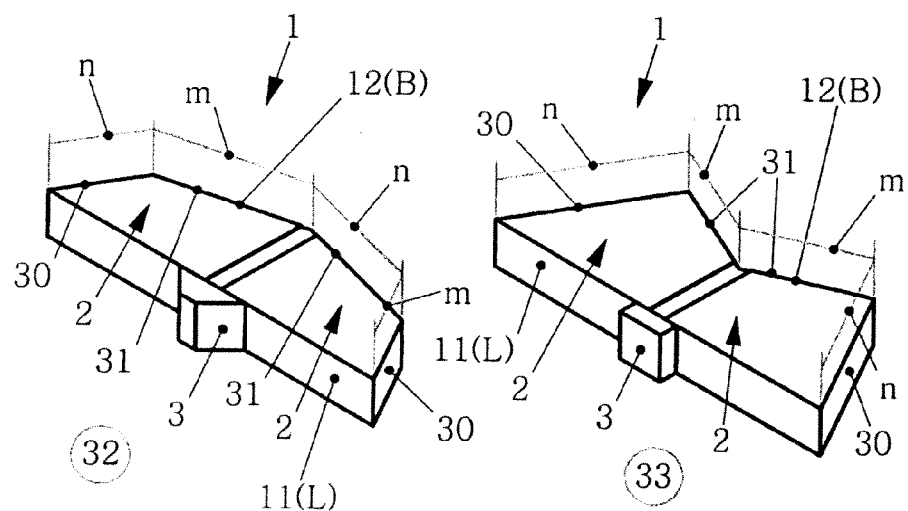
FIG. 7: Views 32 and 33: actuators according to the invention with a second lateral surface area that has a plurality of flat sections

The non-resonant surface 12 according to Views 32 and 33 of FIG. 7 can furthermore have a multiple surface (broken) shape that is formed by a plurality of flat surfaces 30, 31, each with its respective lengths n and m. In this case the length B of the non-resonant surface 12 results from the sum of the lengths n and m of all surfaces 30, 31. It thereby holds true that the length B is greater than the length of the acoustic wave excited in the actuator 1 and each length n and m is not equal to half the wavelength of the excited wave.

Figure 8:
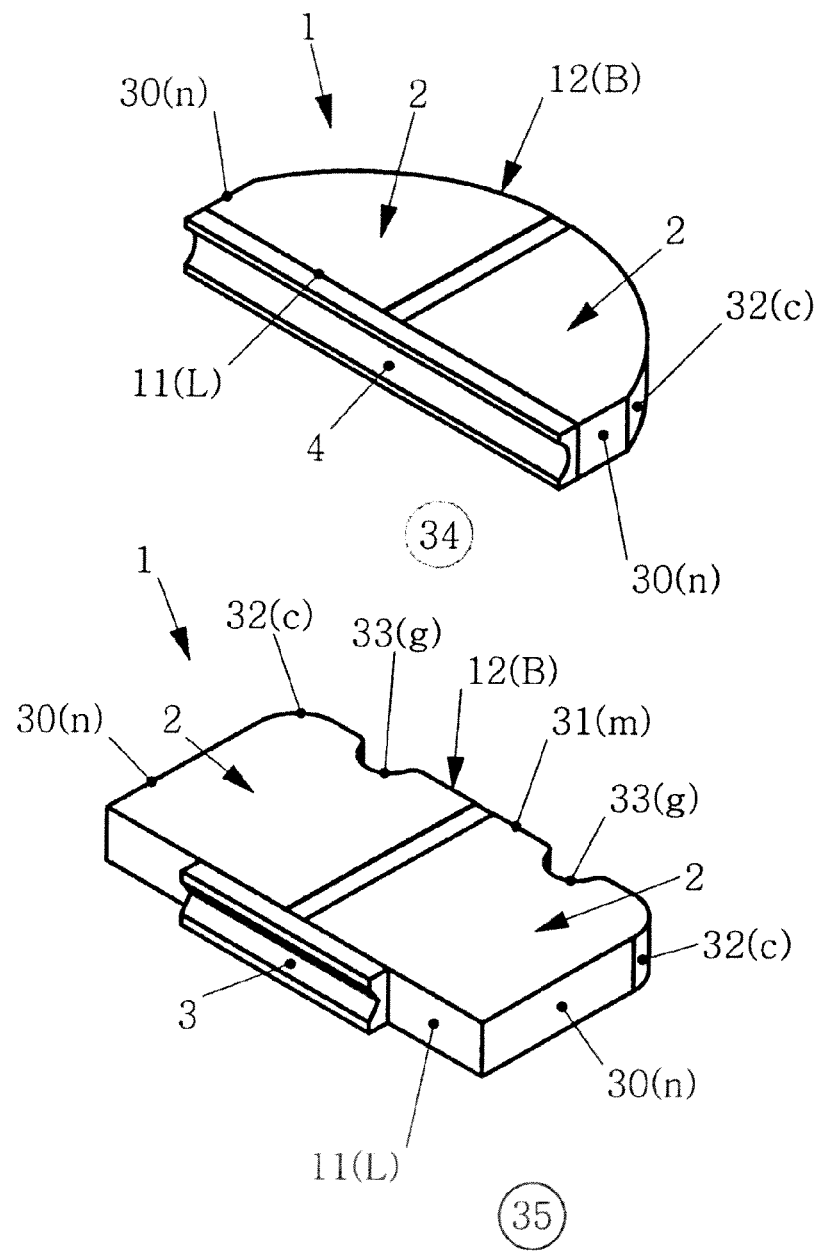
FIG. 8: View 34: an actuator according to the invention in which the friction layer is arranged along the entire first lateral surface area; View 35: an actuator according to the invention with a symmetrically arranged friction element

Furthermore, the non-resonant surface 12 can have a multiple-surface (broken) shape that is formed from a plurality of flat surfaces 30, 31 with their lengths n and m combined with one or more cylindrical, oval or other non-angular surfaces 32, 33 with their lengths c and q, as shown in Views 34 and 35 of FIG. 8. The length B is thereby greater than the wavelength of the acoustic wave excited in the actuator 1 and each length n, m, c, q is not equal to half the wavelength of the wave excited in the actuator 1.

Figure 9:
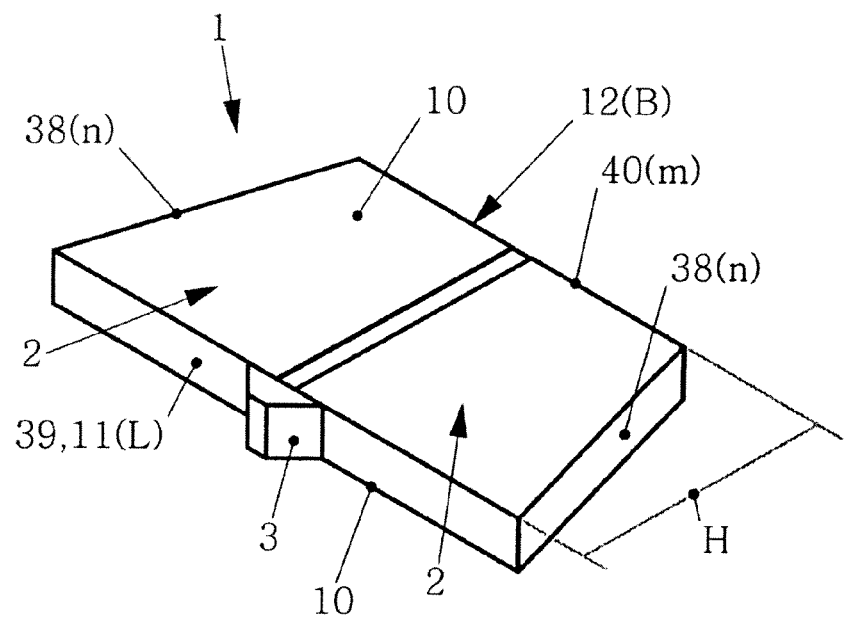
FIG. 9: Views 36 and 37: actuators according to the invention with trapezium-shaped geometry in a top view
Figure 9:
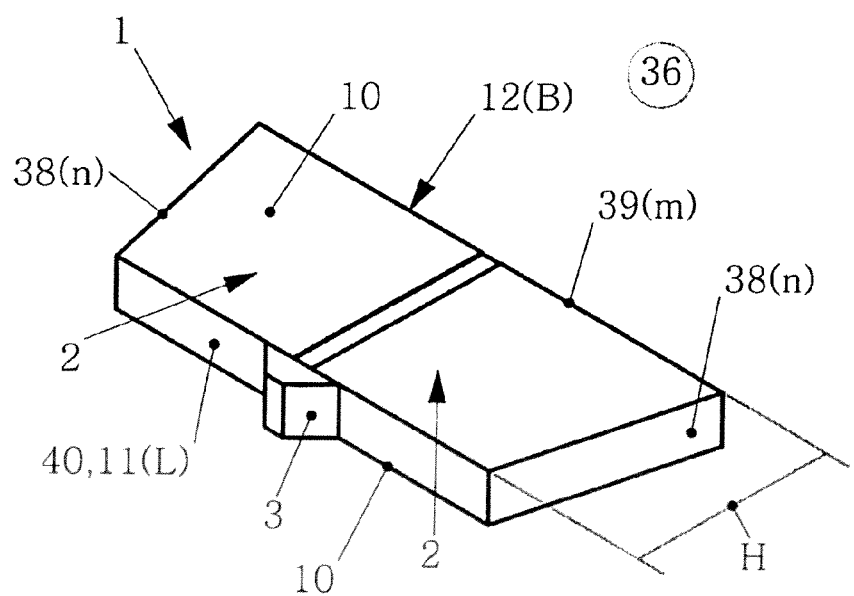

The actuator 1 according to the invention can likewise have the shape of an isosceles trapezium, as shown in Views 36 and 37 of FIG. 9. Such an actuator 1 has two front surfaces 38, a long lateral surface 39 and a short lateral surface 40. The height H of such an actuator is equal to half the wavelength of the wave that is excited. Two execution variants are conceivable for such an actuator 1. In the first case, according to View 36 of FIG. 9, the long lateral surface 39 is the resonant surface while the non-resonant surface is formed by the two front surfaces 38 and the short lateral surface 40. In the second case, according to View 37 of FIG. 9, the short lateral surface 40 is the resonant surface 11. The non-resonant surface here is formed by the two front surfaces 38 and the long lateral surface 39.

Figure 10:
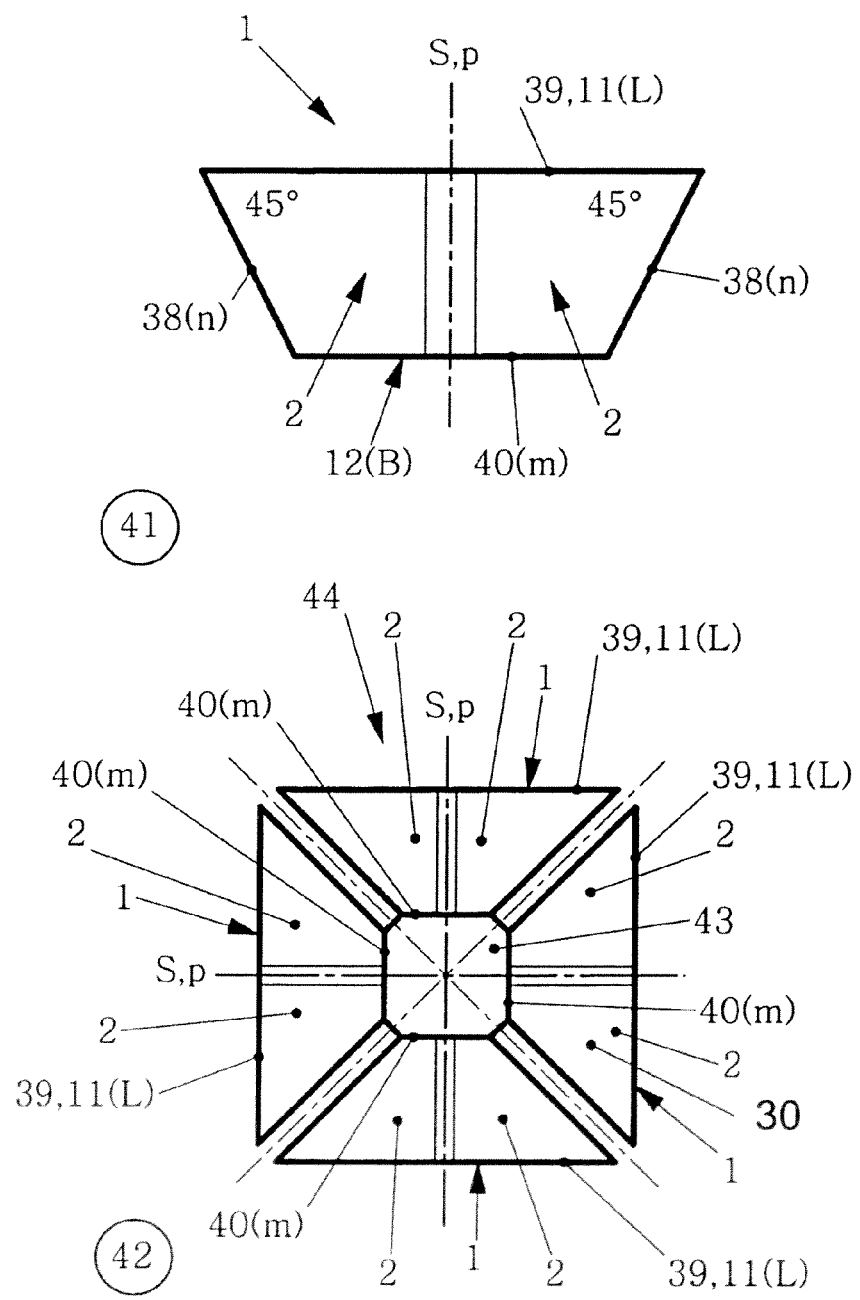
FIG. 10: View 41: an actuator according to the invention with a trapezium-shaped geometry in a top view; View 42: an arrangement of four actuators according to the invention in accordance with View 41, that are acoustically connected to one another by means of a connection element

View 41 of FIG. 10 shows a top view of a trapeziform actuator 1, in which the long lateral surface 39 forms the resonant surface 11. According to View 42 of FIG. 10, for example, four of these actuators can be connected to one another acoustically by means of a connection element 43 for a corresponding drive or motor. In this case, the long lateral surfaces 39 represent the resonant surface 11. The connection element 43 can be manufactured from a sound-insulating material, e.g., from a polymer material. The connection element 43 can just as well be manufactured from a sound-conducting material such as, e.g., oxide ceramic or piezoceramic. The connection of the actuators to the connection element 43 can be brought about by means of gluing or welding to the lateral surface 40. It is also possible to manufacture the connection element 43 by means of pressing during the manufacture of the actuator device 44 manufactured as a monolithic part.

Figure 11:
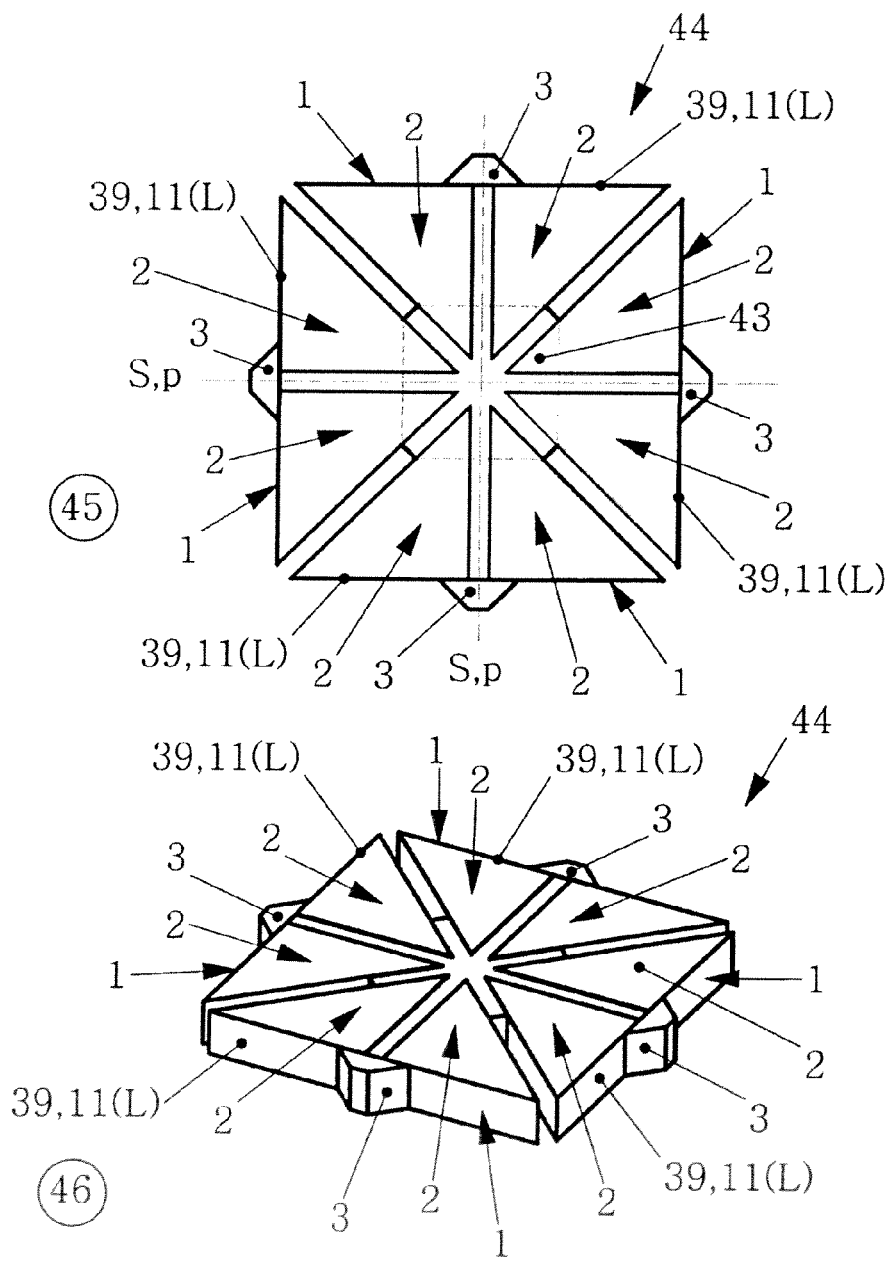
FIG. 11: View 45: a top view of an arrangement of four actuators according to the invention that are substantially triangularly shaped and that are acoustically connected to one another by means of a connection element; View 46: a perspective view of the arrangement in accordance with View 45

Views 45 and 46 of FIG. 11 show an actuator device 44 with four substantially triangle-shaped actuators 1, whereby each actuator 1 has a friction element 3 on the respective resonant surface 11. The friction element 3 is thereby arranged in the middle of the resonant surface 11 symmetrically to the (not shown) plane of symmetry.

Figure 12:
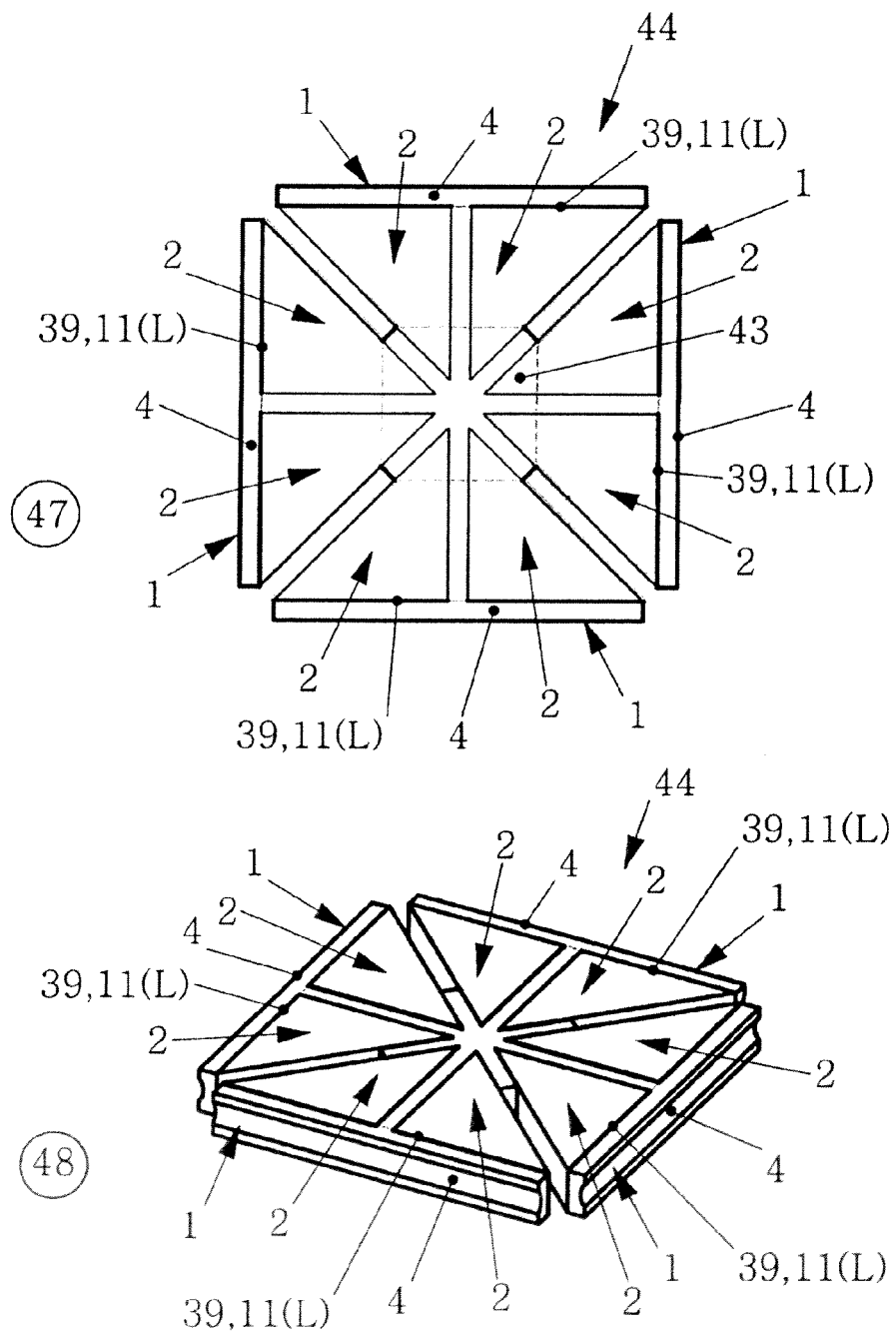
FIG. 12: View 47: a top view of an arrangement of four actuators according to the invention that are connected by means of a connection element and that have a friction layer; View 48: a perspective view of the arrangement in accordance with View 47

Views 47 and 48 of FIG. 12 show an actuator device 44 that likewise has four substantially triangle-shaped actuators 1, whereby each actuator 1 has a friction layer 4 on the respective resonant surface 11. In this case, the friction layer 4 extends across the entire length L of the resonant surface 11.

Figure 13:
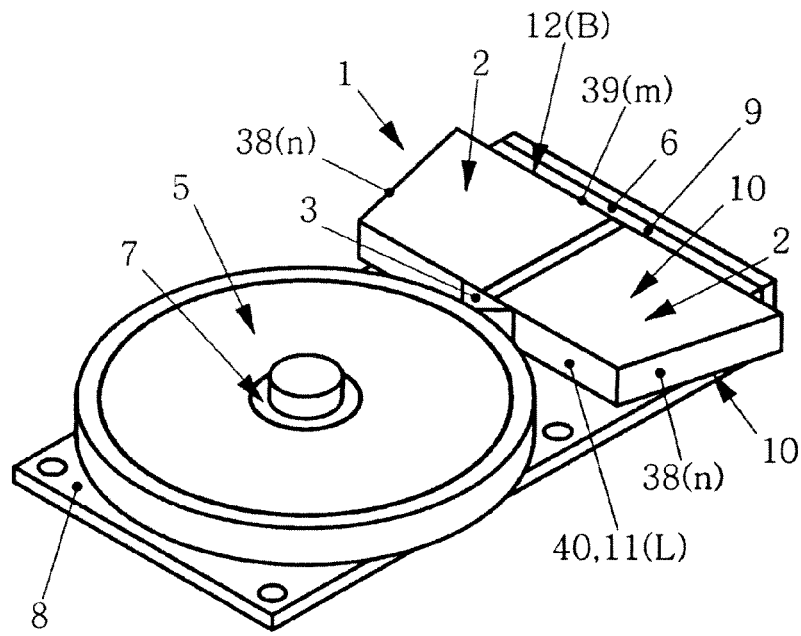
FIG. 13: a motor with an actuator according to the invention for the rotary drive of a disc-shaped element to be driven

FIG. 13 shows a motor with an actuator 1 according to the invention in the form of a trapezium, in which the short lateral surface 40 forms the resonant surface 11. The element 5 to be driven of this motor has the shape of a disc.

Figure 14:
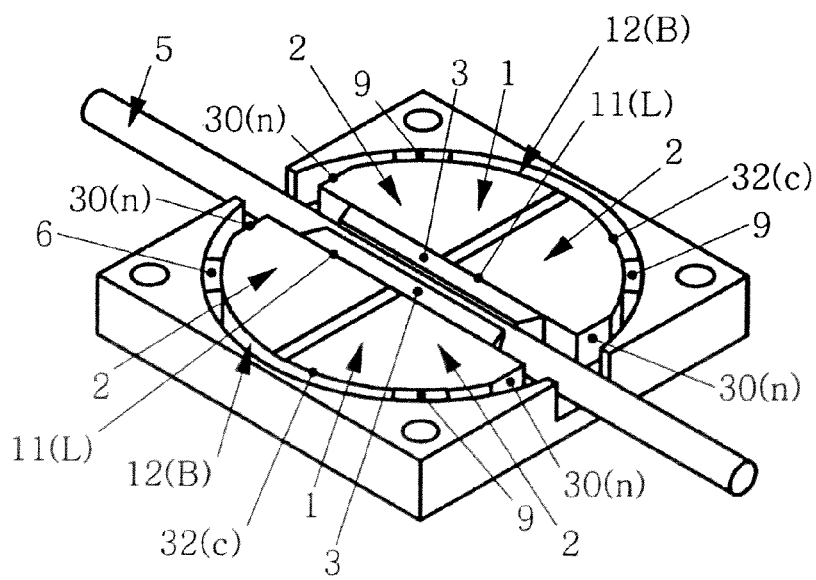
FIG. 14: motor with two actuators according to the invention arranged opposite each other for the movement of a rod-shaped element to be driven that is arranged between them

The motor shown in FIG. 14 has two actuators 1 arranged opposite each other.

Figure 15:
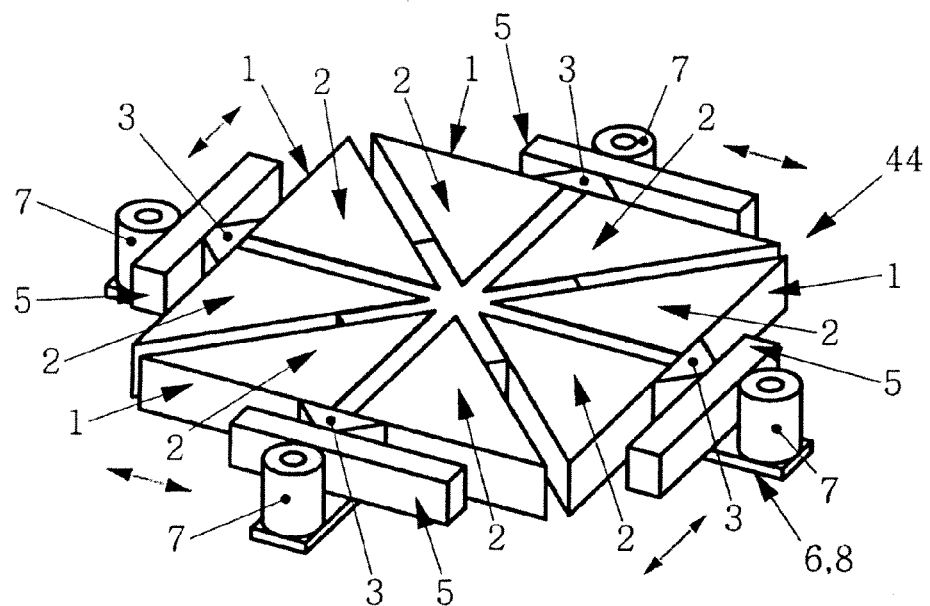
FIG. 15: an embodiment of a motor with four actuators according to the invention, each of which has a friction element

FIG. 15 shows a motor with the actuator device 44 according to FIG. 11, against whose four friction elements 3 the four elements 5 to be driven independently are pressed.

Figure 16:
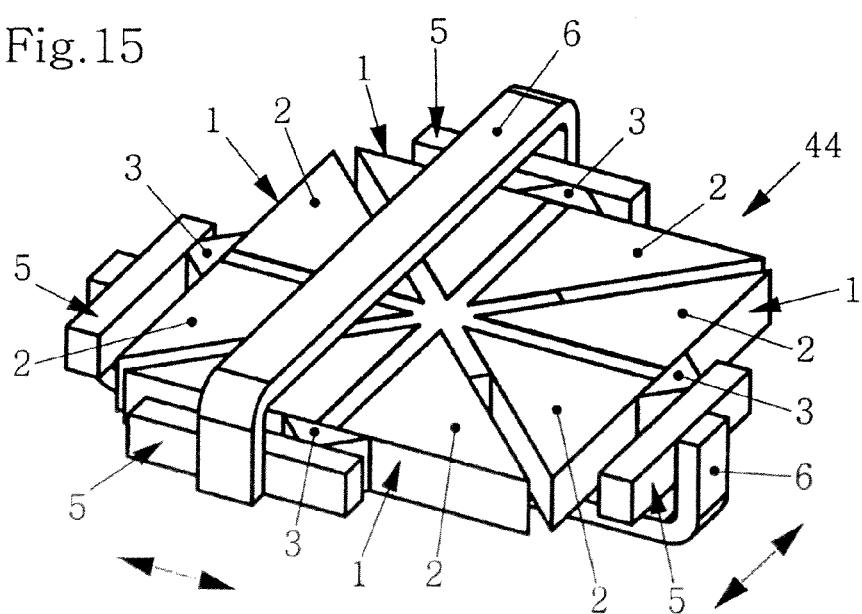
FIG. 16: a further embodiment of a motor with four actuators according to the invention, each of which has a friction element

FIG. 16 shows a motor with the actuator device according to FIG. 11, in which the elements 5 to be driven are connected to one another in pairs by means of the U-shaped spring elements 6.

Figure 17:
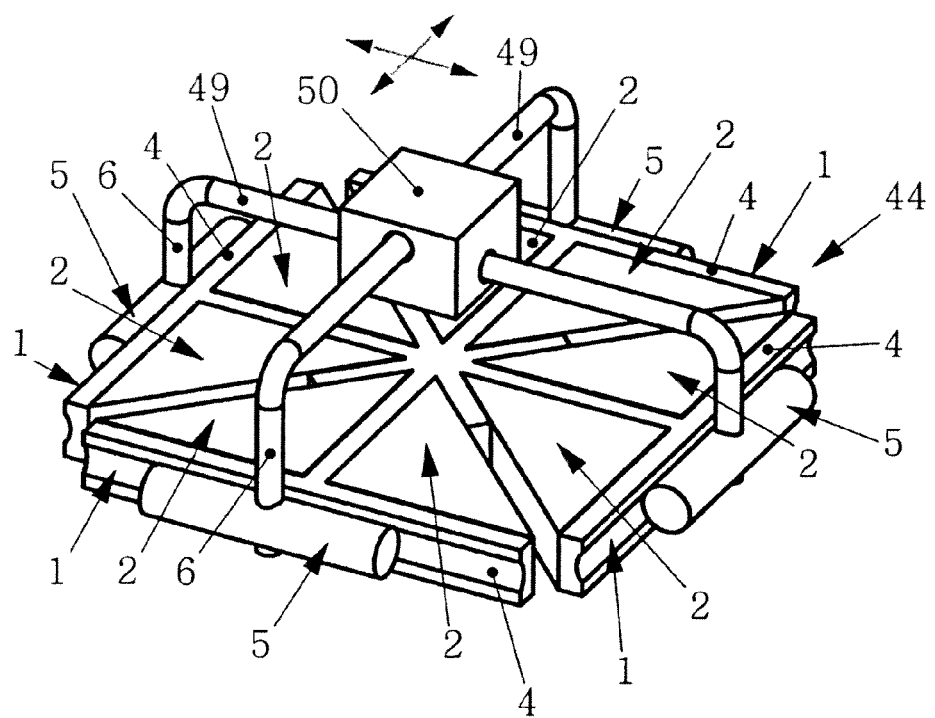
FIG. 17: an embodiment of a motor with four actuators according to the invention, each of which has a friction layer

FIG. 17 shows a motor with the actuator device according to FIG. 12 in which the U-shaped spring elements are executed as guide rails 49, along which the platform 50 moves.

Figure 18:
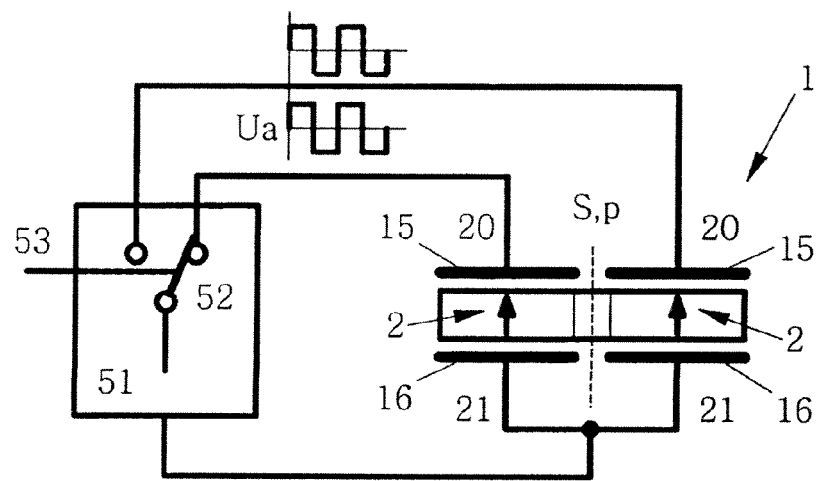
FIG. 18: a block diagram for the explanation of the connection of the electrical excitation device to the actuator of a motor

FIG. 18 shows a block diagram for the explanation of the connection of the electrical excitation device 51 to the actuator 1 of a motor. The excitation device has a changeover switch 52 with one or more control inputs 53 that are used for the connection to one of the acoustic standing wave generators 2. To excite one of the standing wave generators 2 of the actuator 1, the electrical excitation device 51 produces alternating voltage $V_a$, whose frequency is equal to the working frequency of the motor $F_a$. This voltage can have a sinusoidal, trapeziform or rectangular form.

Figure 19:
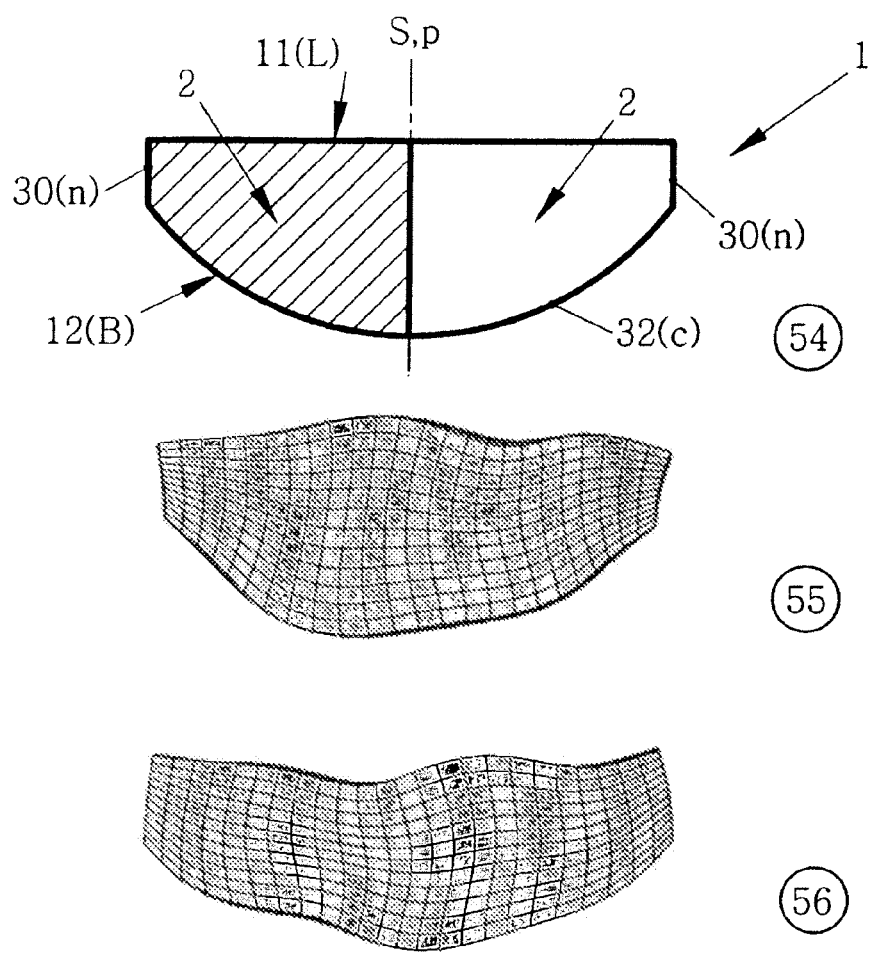
FIG. 19: View 54: an actuator according to the invention in a top view in the ground state; Views 55 and 56: deformation state of the excited actuator according to View 54 at different points in time

View 54 of FIG. 19 schematically shows an actuator 1 whose shape corresponds to the actuator according to View 34 of FIG. 8. Views 55 and 56 of FIG. 19 show the phases of maximum deformation of the actuator during the exciting by means of the standing wave generator 2 (hatched area in View 54).

Figure 20:
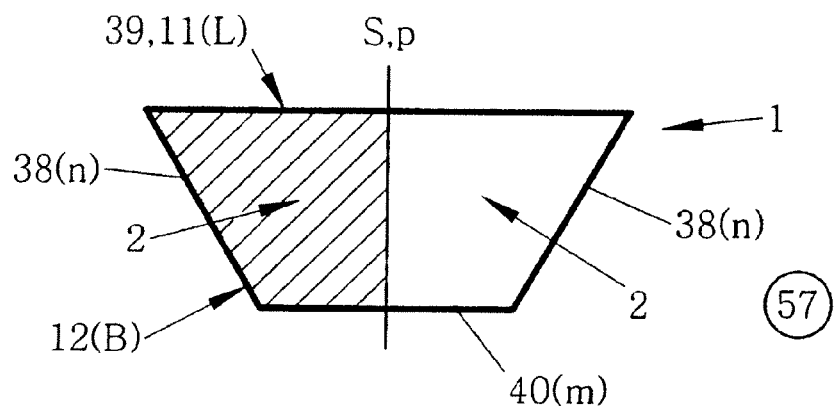
FIG. 20: View 57: an actuator according to the invention in a top view in the shape of a trapezium in the ground state; Views 58 and 59: deformation state of the excited actuator according to View 57 at different points in time
Figure 20:
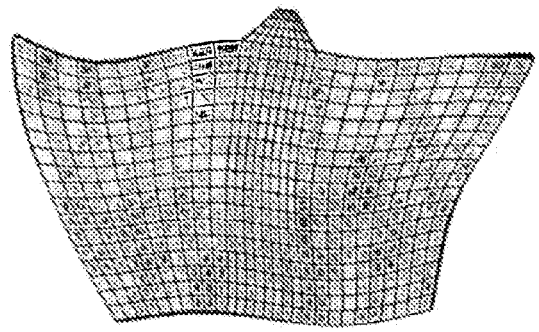
Figure 20:
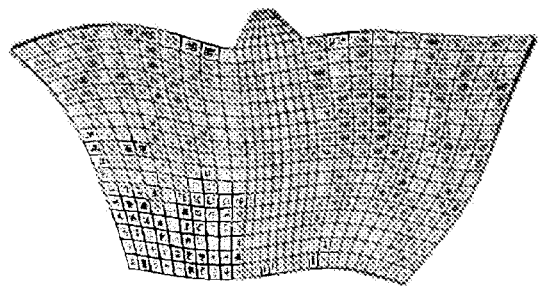

View 57 of FIG. 20 schematically shows an actuator 1 whose shape corresponds to the actuator according to View 36 of FIG. 9. Views 58 and 59 of FIG. 20 show the phases of maximum deformation of this actuator 1 during the exciting by means of the standing wave generator 2 (hatched area of the actuator of View 57).

Figure 21:
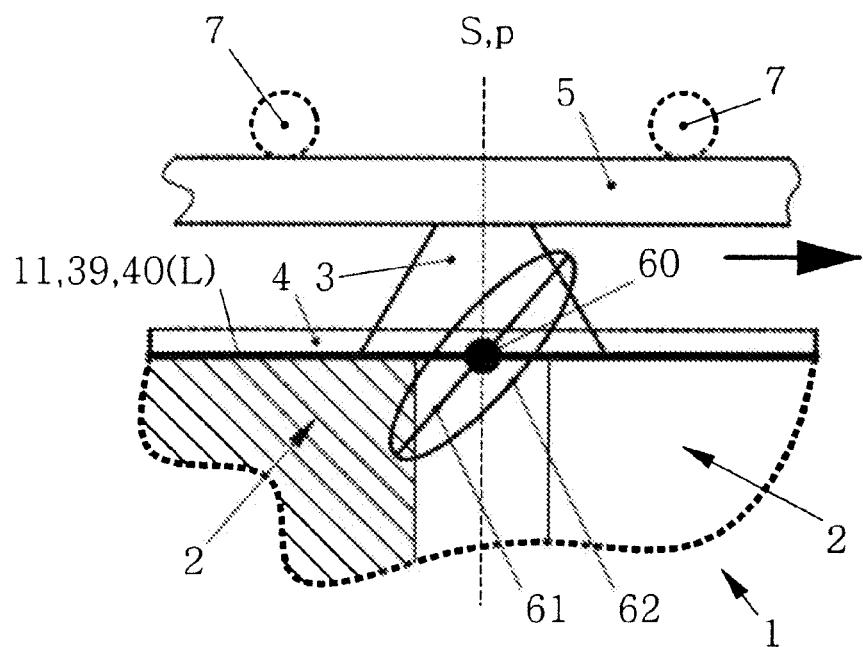
FIG. 21: a figure for the explanation of a functional principle of the motor

FIG. 21 shows an enlarged detail of an actuator 1 according to the invention with a point 60 on the resonant surface 11. When the actuator 1 is excited by means of a standing wave generator 2 (hatched area), this point 60 moves on the linear trajectory 61 or on a circular or elliptical trajectory 62.

Figure 22:
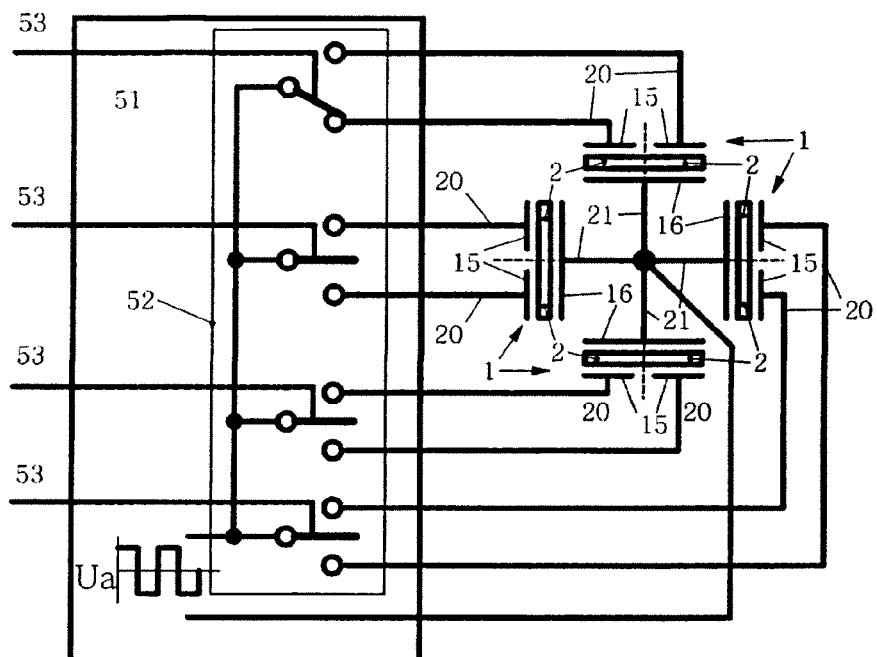
FIG. 22: a block diagram for the explanation of the connection of the electrical excitation device to a plurality of actuators according to the invention that are acoustically decoupled

In a block diagram, FIG. 22 shows the connection of the electrical excitation device 51 to four actuators 1 arranged in a cross shape, whereby the actuators 1 are acoustically decoupled from one another or are only weakly connected to one another.

Figure 23:
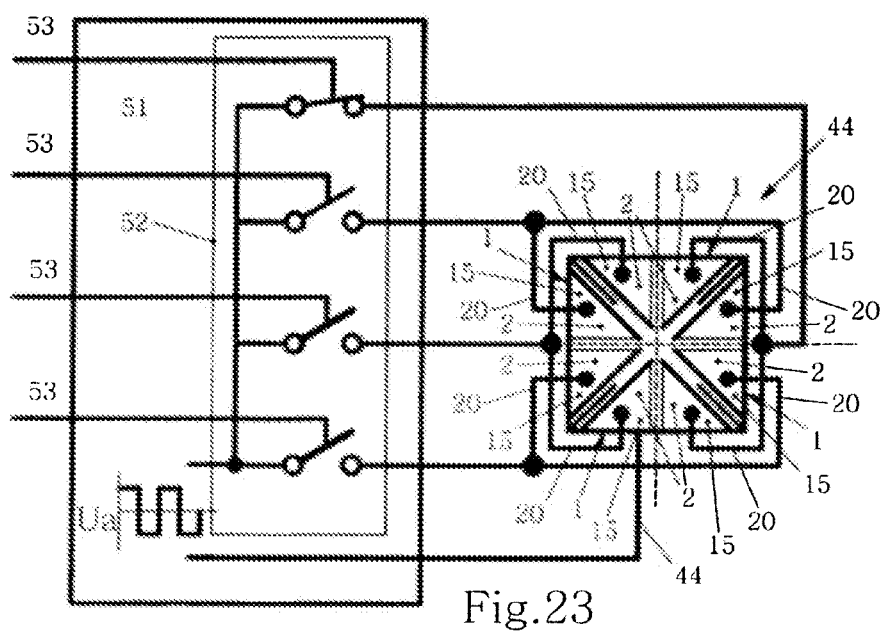
FIG. 23: a block diagram for the explanation of the connection of the electrical excitation device to a plurality of actuators according to the invention that are acoustically connected to one another

In a block diagram, FIG. 23 shows the connection of the electrical excitation device 51 to the actuator device 44 according to FIG. 11, 12, 15, 16, 17 that comprises four actuators 1 that are acoustically connected to one another.

The electrical excitation device 51 can have a half-bridge or bridge power amplifier 63, whose output or whose outputs 64, 65 are connected to the acoustic standing wave generators 2 of the actuator 1 directly or by means of the step-up transformer 66.

The power amplifier 63 can be executed as a linear amplifier or as a switching power amplifier. Input 67 or output 68 of the power amplifier 63 can be connected to the output or the outputs 69, 70 of the control generator 71 with the control input 72. The signal frequency acting on the output 69 is adjusted with the help of the control input 72. The control generator 71 can be executed as a voltage-regulated control generator or it can contain a digitally regulated control generator. For this reason, the control generator 71 can be regulated with the help of the analogue or digital signal by means of the control input 72. The power amplifier 63 can have a separate input 73 for the connection of the supply voltage E.

Figure 26:
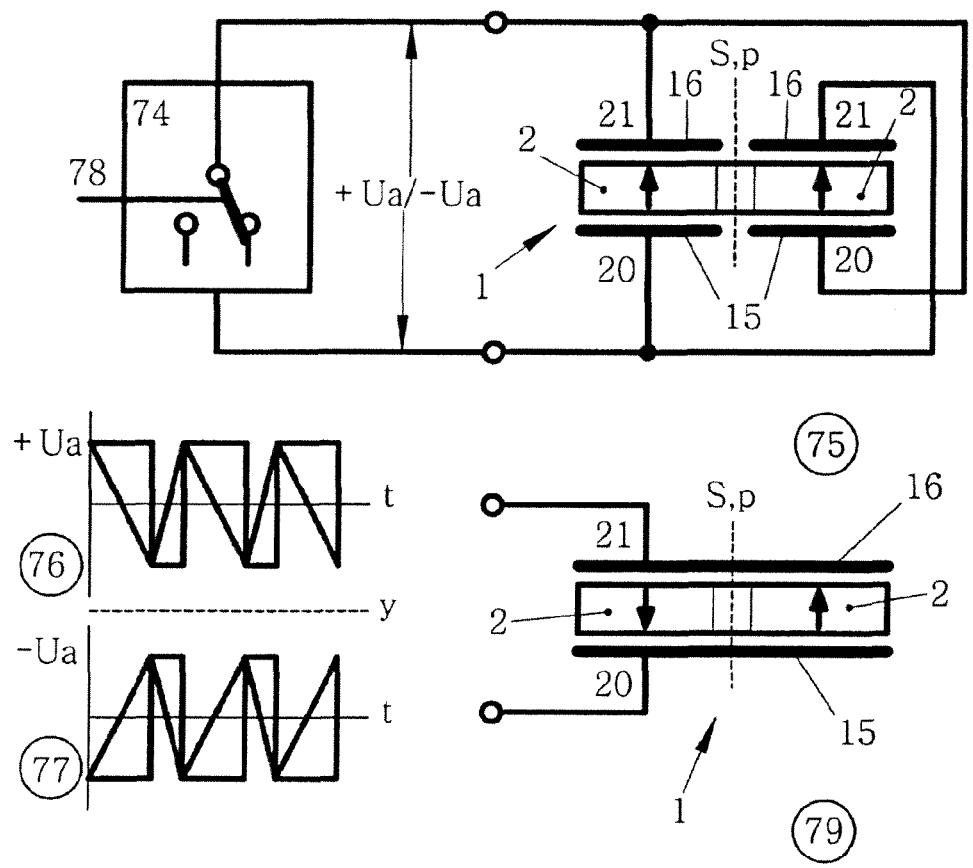
FIG. 26: a block diagram for the explanation of the connection of the electrical excitation device to an actuator according to the invention, whereby the generators are connected with inverse phases (View 75) or have different polarisations (View 79)

According to View 75 of FIG. 26, the standing wave generators 2 of the actuator 1 are connected with inverse phases and are connected to the electrical excitation device 74. In this case, the electrical excitation device 74 provides a non-symmetrical electrical voltage $+V_a$ or $-V_a$ that can have a rectangular or jagged form or another form other than that shown in Views 76 and 77 of FIG. 26.

Such an electrical excitation device 74 has a control input 78 with which the shape of the voltage can be changed in a mirror-image form relative to the line y, parallel to the time axis t. The frequency of the voltage $+V_a$ or $-V_a$ is equal to the frequency $F_a$.

The inversely phased connection of the standing wave generators 2 is brought about by connecting the electrodes 15 and 16 crosswise or by differently aligned polarisation of the piezoceramic, as is shown in View 79 of FIG. 26.

Figure 27:
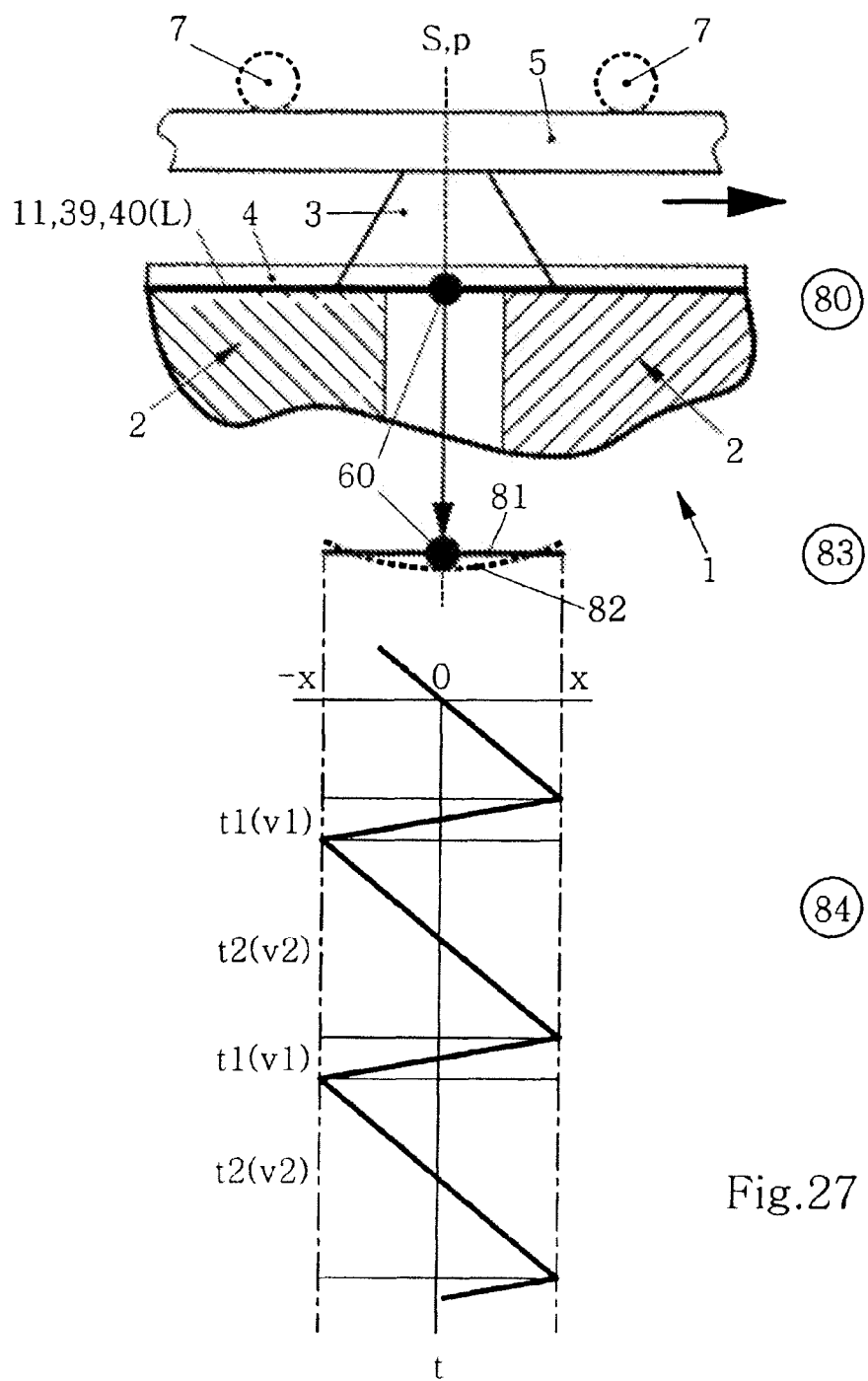
FIG. 27: a figure for the explanation of a further functional principle of the motor

View 80 of FIG. 27 shows the middle part of an actuator 1 according to the invention with the material point 60 on the resonant surface 11. When controlling the actuator 1 with the help of the two standing wave generators 2 connected with inverse phases, this point moves on a linear trajectory 81 or on a slightly curved trajectory 82, from −x to x, as shown in View 83. The trajectories run symmetrically to the plane S and the line p.

View 84 of FIG. 27 shows the chronological course of the movement of the material point 60. From this it follows that during the movement in one direction, the material point 60 runs through the distance 2x in the time t1 and during the movement in the other direction in the time t2. This means that the material point 60 moves at different speeds (v1 and v2) depending on the direction of the movement.

Figure 28:
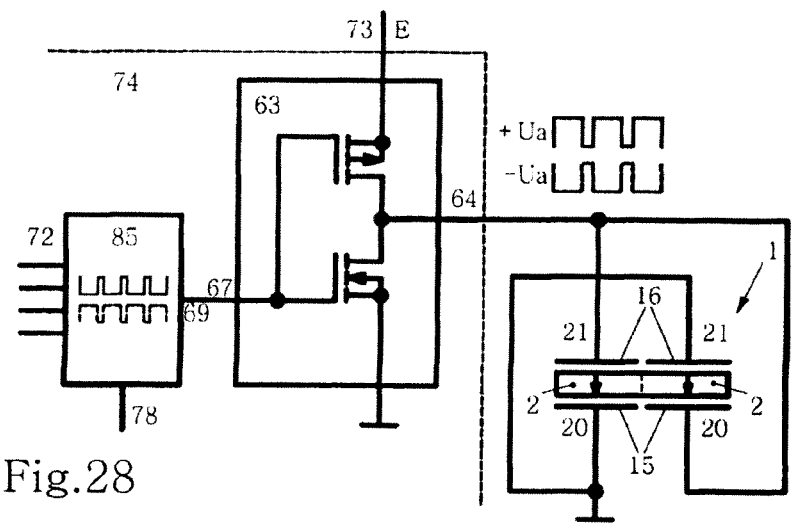
FIG. 28: a block diagram of a further embodiment of the electrical excitation device
Figure 29:
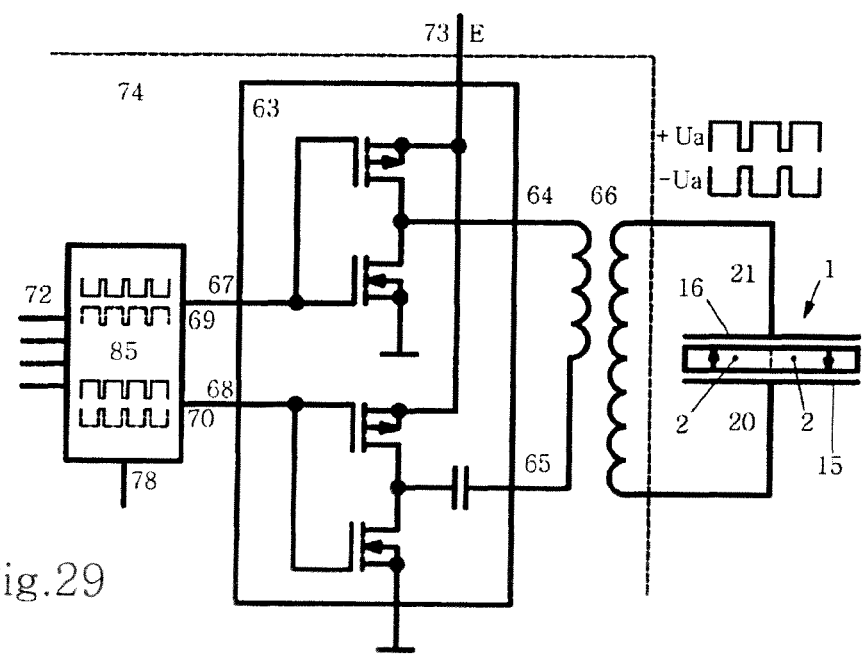
FIG. 29: a block diagram of a further embodiment of the electrical excitation device

According to FIG. 28 and FIG. 29, the electrical excitation device 74 comprises the generator 85, which provides a non-symmetrical voltage whose shape can be changed in a mirror-image manner with the help of the control input 78 and the frequency of which can be adjusted with the control input 72. The generator 85 can be executed as a voltage-regulated generator or it can include a digitally regulated control generator. For this reason, the control generator 85 can be regulated with the help of the analogue or digital signal by means of the control input 72.

Figure 30:
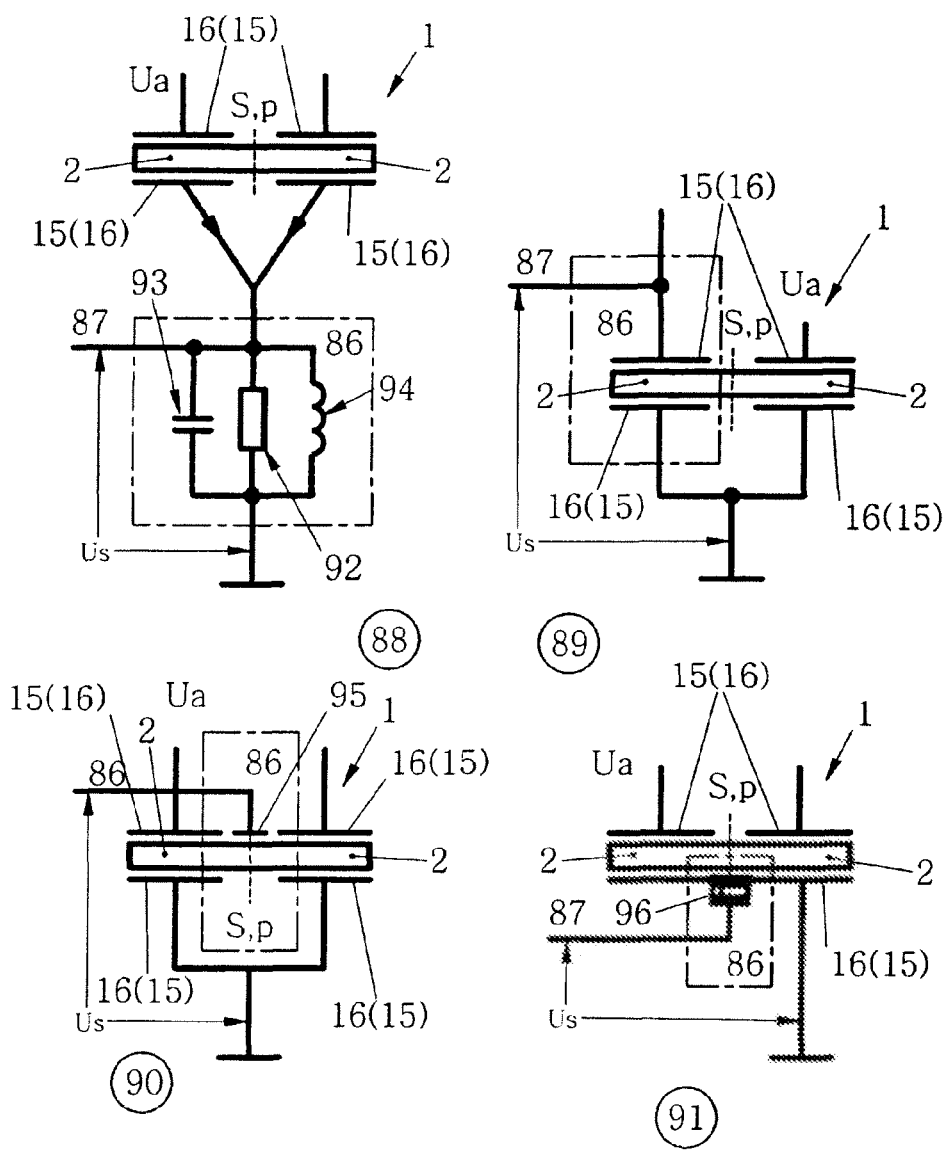
FIG. 30: Views 88-91: block diagrams for the explanation of embodiments of the feedback element of an actuator according to the invention

According to Views 88 to 91 of FIG. 30, the actuator 1 can have a feedback element 86 that has an output 87. A signal voltage of the feedback element $V_s$ is provided at the output 87. According to View 88 of FIG. 30, the feedback element 86 can consist of the actuator 1 that is connected in series to the standing wave generator 2. In this case, the resistor 92, the capacitor 93 or the inductor 94 represents the feedback element. These components can be connected individually, in pairs or in any other combination.

The electrode 15 or 16 of the actuator 1 can also serve as the feedback element according to View 89 of FIG. 30.

According to View 90 of FIG. 30, an additional auxiliary electrode 95 executed as a feedback element 86 can be located on the actuator 1.

In a further execution variant according to View 91 of FIG. 30, an auxiliary piezoelement 96 executed as a feedback element 86 can be located on the actuator 1.

Figure 31:
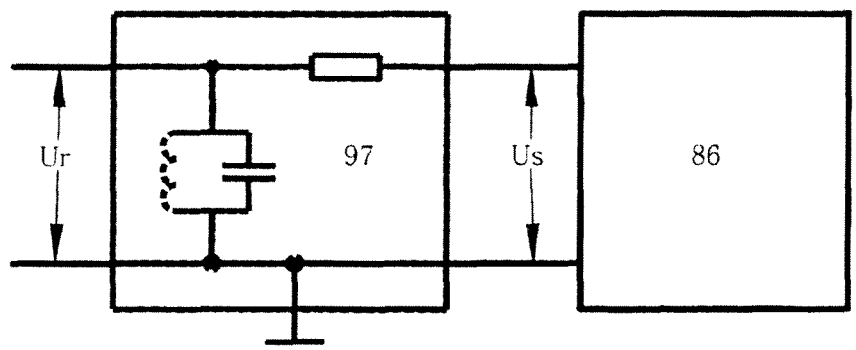
FIG. 31: a block diagram for the explanation of the connection of the feedback element to a filter for the first harmonic

According to FIG. 31, the feedback element 86 can be connected to the filter of the first harmonic 97 of its output voltage $V_s$ in the excitation device 51, 74. The filter 97 can represent a simple LC band filter, it can be executed as an active filter for low frequencies or it can be executed as an active band filter. The filter 97 can also be a digital filter. The job of the filter 97 is to filter out the first harmonic of the voltage $V_s$ of the feedback element. Appearing at the output of the filter 97 is the sinusoidal voltage $V_r$.

The electrical excitation device 51, 74 can furthermore contain a phase detector 98 (see FIG. 32) that has a support input 99 and a measurement input 100. The excitation voltage $V_a$, which is the voltage that excites the standing wave generator 2 of the actuator 1, or a voltage that falls in phase with this voltage is applied to the support input 99. The voltage $V_s$ or $V_r$ is applied at the measurement input 100. The phase detector 98 can consist of the comparators 101 and 102 that form the voltage flanks $V_a$ and $V_r$. At its output, the phase detector 98 produces an analogue or a discrete signal that contains the information regarding the angle of the phase shift φ between the voltages $V_a$ and $V_r$.

Figure 33:
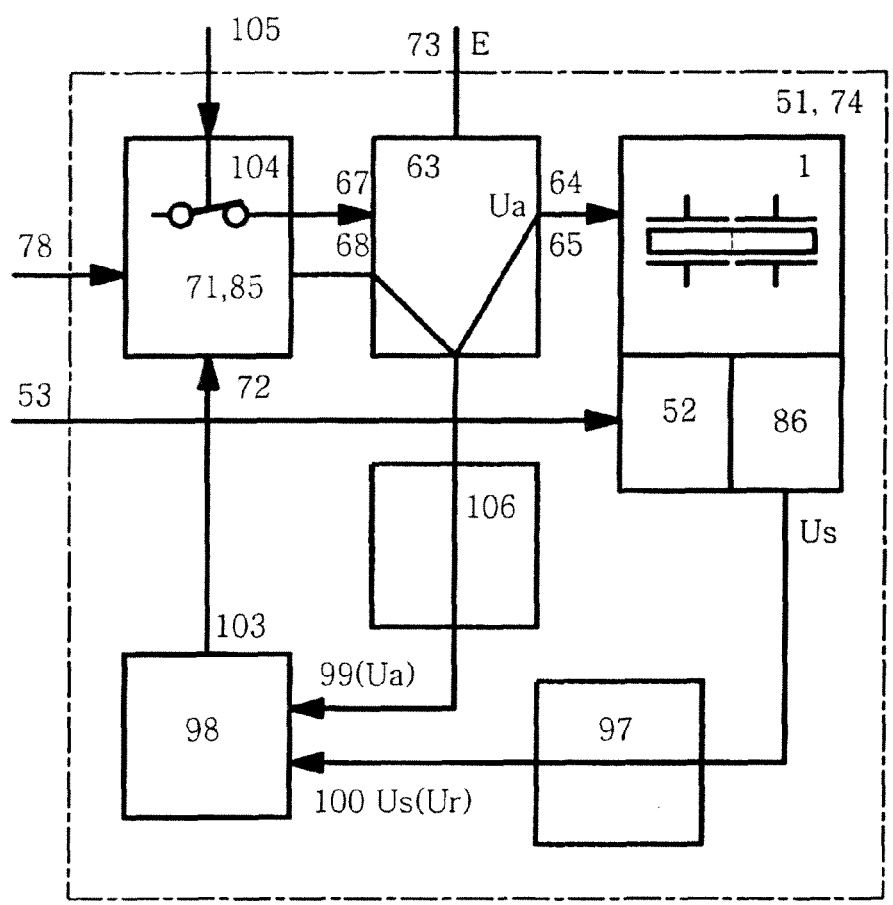
FIG. 33-35: block diagrams of further embodiments of the electrical excitation device

FIG. 33 shows the block diagram of an excitation device for the one motor with the actuator 1 according to the invention. The electrical excitation device 51, 74 can contain the on-off switch 104 with its control input 105 that is used to start and stop the motor. The electrical excitation device 51, 74 can furthermore contain the filter 106 of the first harmonic of the voltage $V_a$ similarly to the filter 97.

Figure 34:
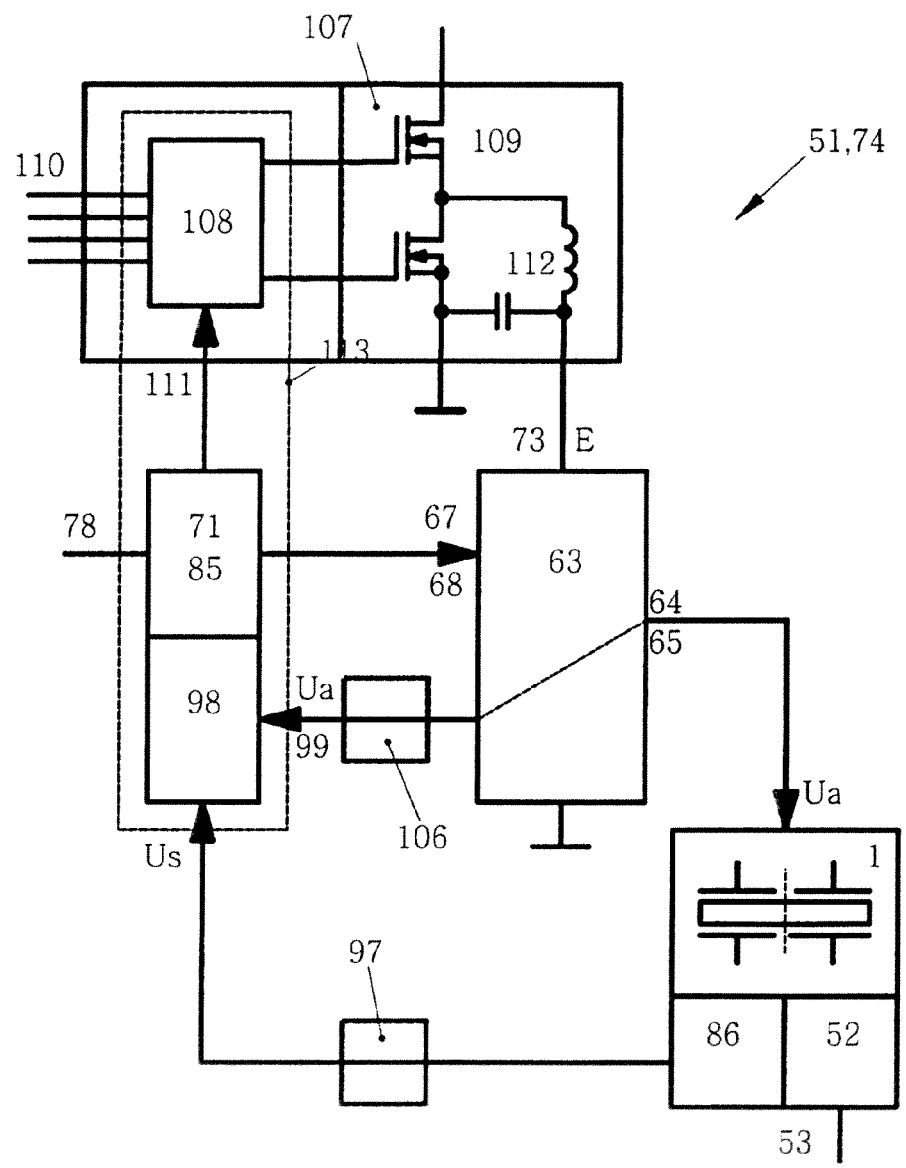

According to FIG. 34, the electrical excitation device 51, 74 can contain a controller 107 for the voltage E of the power amplifier 63. Such a controller can consist of the PWM modulator 108 with the power amplifier 109. The modulator 108 can have an analogue or digital control input 110 and a synchronization input 111. The width of the PWM pulses is changed with the control input 110. The power amplifier 109 contains the filter 112.

The filters of the first harmonic 97 and 106, the phase detector 98, the control generator 71, 75 and the PWM modulator 108 can be implemented by means of corresponding programming of the digital arithmetic unit 113, which can be an integrated DSP or FPGA microprocessor circuit.

Figure 35:
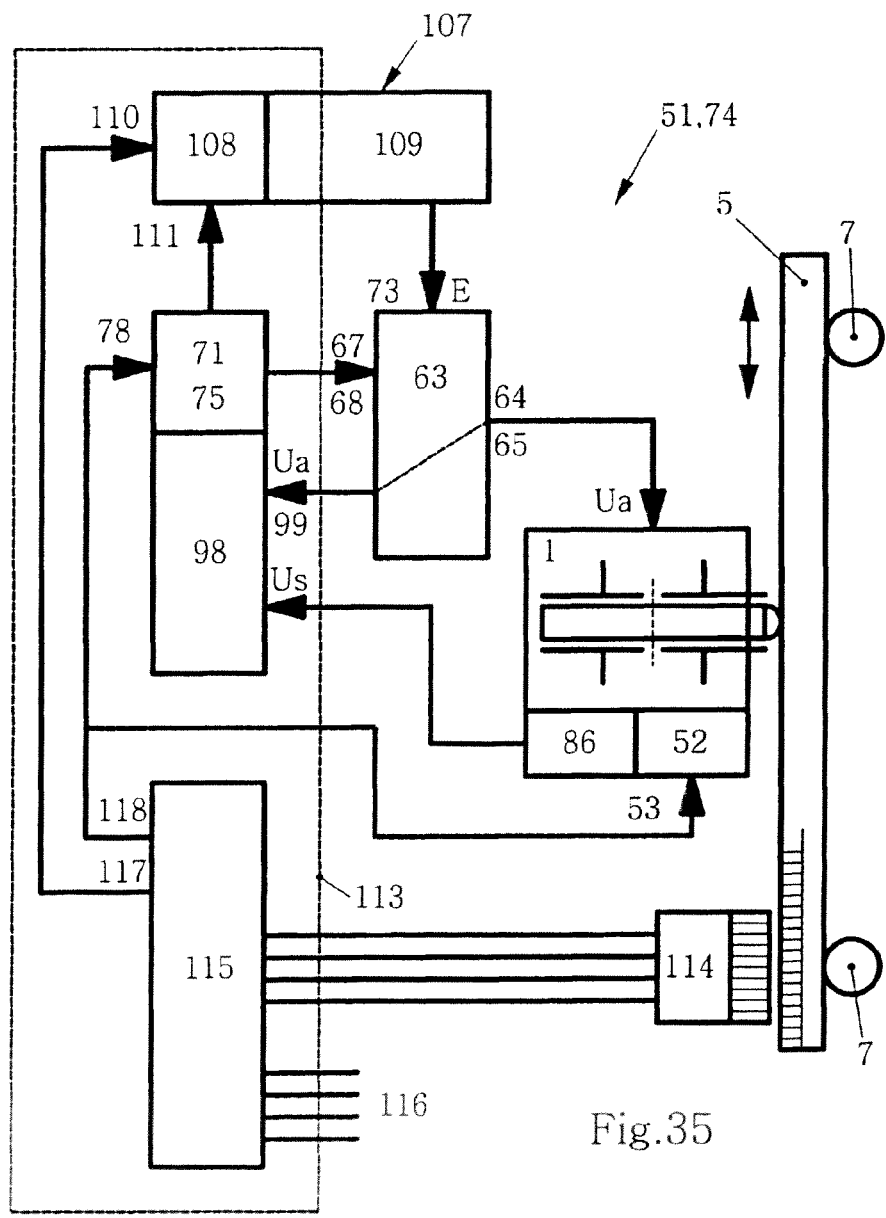

According to FIG. 35, the element of a motor that is to be driven with the actuator according to the invention can be equipped with a position or speed encoder 114 and the electrical excitation device 51, 74 can contain a controller 115 for the position or speed of the element 5 to be driven. The controller 115 can have a reference input 116, an output 117 for controlling the direction of movement and an output 118 for controlling the speed of movement for the element 5 to be driven. In other execution variants, the outputs 117 and 118 can be connected to each other. The controller 115 can be executed as a separate digital computer assembly, e.g., as a DSP or FPGA. The controller 116 can furthermore be a digital arithmetic unit 113.

The control of the actuator according to the invention can take place in two ways in principle:

According to a first functional principle, the electrical excitation device 51 applies an exciting alternating voltage $V_a$ on the layer of the exciting electrode 15 and on the layer of the general electrode 16 of one of the acoustic standing wave generators 2. Due to the inverse piezoelectric effect, the electric field that forms between the electrodes 15 and 16 brings about a deformation of the actuator 1 due to the effect on the piezoelectric ceramic layer 17. The size of the deformation amplitude is determined by the electric field strength, which in turn depends on the level of the electrical voltage $V_a$ and the thickness of the piezoelectric ceramic layer 17.

The level of the electrical voltage $V_a$ can be reduced as needed by dividing the standing wave generators 2 into sections, i.e., in a plurality of layers (i.e., multiple-layer construction).

The frequency $F_a$ of the excitation voltage $V_a$ is selected such that it equals the frequency $F_o$ that corresponds to the resonant frequency of the second mode of the longitudinal oscillations of the resonant surface 11, or the frequency can be close to this frequency. At the frequency $F_o$ ($F_a$), an acoustic wave whose length is equal to L propagates along the resonant surface 11 of the actuator 1.

Because the resonant surface 12 does not represent a resonant surface for this frequency (its length B is not a multiple of half the wavelength of the wave excited in the actuator 1), it is also the case that no acoustic wave propagates along this surface.

This means that the material points of the actuator 1 located on the resonant surface 11 have a greater average amplitude than do the material points lying on the non-resonant surface 12. One resonant region 23 in which resonance oscillations of the actuator 1 arise can consequently virtually be identified on the actuator 1 according to the invention. A non-resonant region for the actuator 1 is located outside this resonant region 23.

The frequency $F_o$ can be approximated by the formula $F_o=N/L$, where N is the frequency constant that depends somewhat on the type of the piezoceramic and the shape of the actuator 1. For the actuator that is shown in View 34 of FIG. 8 and made of piezoceramic PIC 181 from the company PI Ceramic, with L=50 mm, n=8 mm, c=60 mm and h=10 mm, N=4694.9 kHz mm.

The actuator 1 according to the invention is executed symmetrically to the plane of symmetry S (p) and the acoustic standing wave generator 2 is arranged symmetrically to this plane S and to both sides of this plane.

Because in the case under consideration, the electrical excitation voltage $V_a$ is applied only to one of the standing wave generators 2, only this standing wave generator 2 also deforms the actuator 1, namely at this point. An acoustic wave is produced in the actuator 1 as a result of this deformation. The actuator 1 counteracts the propagation of the acoustic wave at the points at which the standing wave generator 2 is located and at which the electric excitation voltage $V_a$ is not applied.

As a result, an asymmetrical standing wave forms in the actuator 1. As a result of the propagation of the asymmetrical wave, the material points of the actuator 1 lying on the resonant surface 11 in its central part move on tilted linear trajectories 61 or on elliptical trajectories 62 (shown in FIG. 21 for the material point 60). The angle of tilt of the trajectories 61 and 62 to the resonant surface 11 depends on the shape of the actuator 1. FIG. 21 shows an acoustic wave in which trajectories 61, 62 that are tilted toward the resonant surface 11 arise, whereby these can be said to be right-tilting waves.

The actuator 1 according to the invention can have an additional resonant length H or two additional resonant lengths G (Views 22, 25 and 26 of FIG. 5) that are arranged to the side of the middle of the resonant surface 11. Views 55 and 56 of FIG. 19 show the deformation of an actuator 1 in which additional resonance occurs relative to the length G. The excitation of this additional resonance together with the fundamental resonance makes it possible to vary the elliptical trajectory 62 according to FIG. 21 in such a manner that it becomes wider.

The friction element 3 or the friction layer 4 is arranged on the resonant surface 11 symmetrically to the plane of symmetry S (p); this is why the material points of the friction element 3 or of the friction layer 4 move on comparable trajectories 61 and 62.

The movement of the friction element 3 or of the friction layer 4 on tilted trajectories 61 or on elliptical trajectories 62 brings about a movement of the element 5 to be driven indicated with the arrow in FIG. 21.

By switching the changeover switch 52 of the standing wave generators 2, it is possible to produce a right-tilted (FIG. 20, 21) or a left-tilted (not shown) standing wave in the actuator 1. In this way, it is possible to reverse the direction of movement of the element 5 to be driven.

According to a second functional principle, both standing wave generators 2 are connected in phase. The asymmetrical electrical voltage $+V_a$ (or $-V_a$) provided by the electrical excitation device 74 is thereby applied to both standing wave generators 2 (Views 75 to 77 of FIG. 26). The frequency of the voltage $V_a$ is selected in such a manner that it is equal to the frequency $F_o$ that corresponds to the resonant frequency of the second mode of the longitudinal waves along the resonant surface 11. Due to the effect of this voltage, the material point 60 (Views 80 and 83 of FIG. 27) moves on the linear trajectory 81 or on the slightly curved trajectory 82.

The action of the asymmetrical electrical voltage on the actuator 1 in which the standing wave generators 2 are connected in inverse phases and which has the changing length L, L1, L2, L3 (see FIG. 3) leads to a movement of the material point 60 that is asymmetrical in time. This asymmetry is expressed in that the material point 60 moves faster in the first half of the period (t1, v1) than in the second half of the period (t2, v2), namely as shown in View 84 of FIG. 27. The friction element 3 of the actuator 1 also moves similarly.

The movement of the material point 60 that is asymmetrical in time can be explained by the fact that for the majority of the harmonics of the excitation voltage $+V_a$ (or $-V_a$) the lengths (L1, L2, L3) represent the resonant lengths.

Due to the non-linearity of the friction contact between the friction element 3 and the element 5 to be driven, a movement force arises that pushes the element 5 to be driven in the direction that is indicated in FIG. 27 by the arrow.

The change in the voltage shape $+V_a$ by means of the changeover switch 78 into its mirror image $-V_a$ (Views 75 to 77 of FIG. 26) results in a change in the direction of action of the force, i.e., it brings about a change in the direction of movement of the element 5 to be driven.

Both of the previously described functional principles apply at least to the actuator types shown in FIGS. 6 to 10.

The actuator according to the invention can be used in motors in which the element/elements 5 that is/are to be driven execute(s) a longitudinal movement or a rotational movement.

If the actuator 1 is executed as an isosceles trapezium in which the long lateral surface 39 (see View 36 of FIG. 9 and View 57 of FIG. 19) forms the resonant surface 11 with the length L, the actuator 1 oscillates in the manner shown in Views 58 and 59 of FIG. 20. In this case, the angle between the lateral surface 39 and the front surface 38 can be selected to be 45° (see View 41 of FIG. 10).

A motor can, for example, have four actuators 1 according to the invention that are arranged such that they form a Maltese cross (View 42 of FIG. 10). In this case, the actuators 1 can be acoustically decoupled.

The actuators can furthermore be coupled to one another acoustically with the help of the connection element 43, that has a sound-conducting material or that is made of this material. In this case, all four actuators 1 form an acoustically connected actuator device 44 that oscillates like a monolithic actuator (see View 42 of FIG. 10).

The aforesaid actuator 44 can have a friction element 3 on each of its lateral surfaces 39 (see Views 45 and 46 of FIG. 11).

A motor with such an actuator device 44 can have elements 5 to be driven independently (see FIG. 15) or elements 5 to be driven that are connected in pairs (see FIG. 16).

The standing wave generators 2 of the actuator device 44 of a motor with elements 5 to be driven independently can be connected to the excitation device 5 in accordance with FIG. 22.

The actuator device 44 can furthermore have the friction layers 4 on its lateral surfaces 39 (see Views 47 and 48 of FIG. 12).

A motor with such an actuator device 44 can contain elements 5 to be driven that are connected in pairs that cause the platform 50 to move. Such a motor allows a two-coordinate displacement of the platform 50, as shown in FIG. 17 with arrows.

The standing wave generators 2 of the actuator device 44 of the motor with elements 5 to be driven that are connected in pairs in accordance with FIG. 16 and FIG. 17 can be connected to the excitation device 51 in the manner shown in FIG. 23.

A half-bridge power amplifier 63 can be used in the electrical excitation device 51, 74 (see FIG. 24, 25, 28, 29).

The output 64, 65 of the power amplifier 63 can be connected to the acoustic standing wave generator 2 of the actuator 1 directly or by means of the step-up transformer 66. The electrical excitation voltage $V_a$ provided by the power amplifier 63 can have a sinusoidal, trapeziform or rectangular shape.

The shape of the electrical excitation voltage $V_a$ is given by the generator 71, 85. The frequency $F_a$ of this voltage can be regulated by means of an analogue or digital signal applied to the control input 72.

Figure 24:
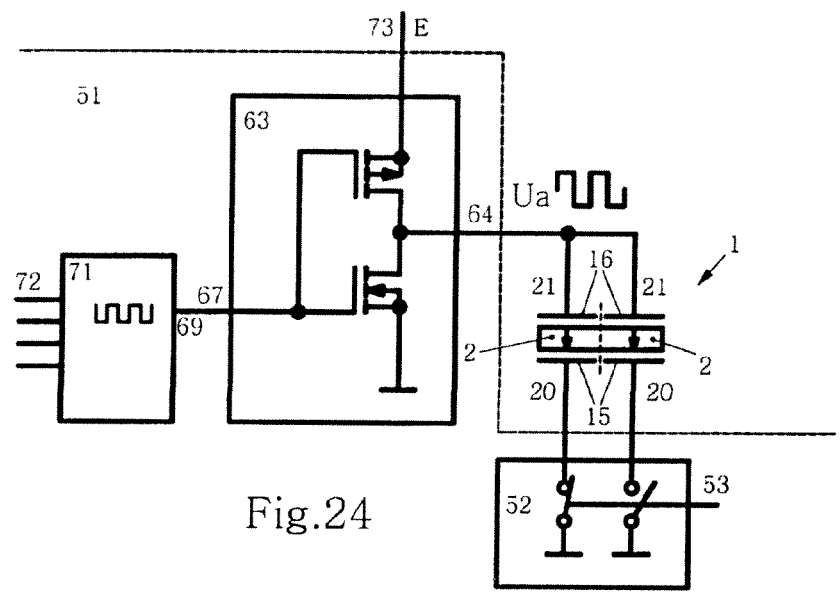
FIG. 24: a block diagram of an embodiment of the electrical excitation device
Figure 25:
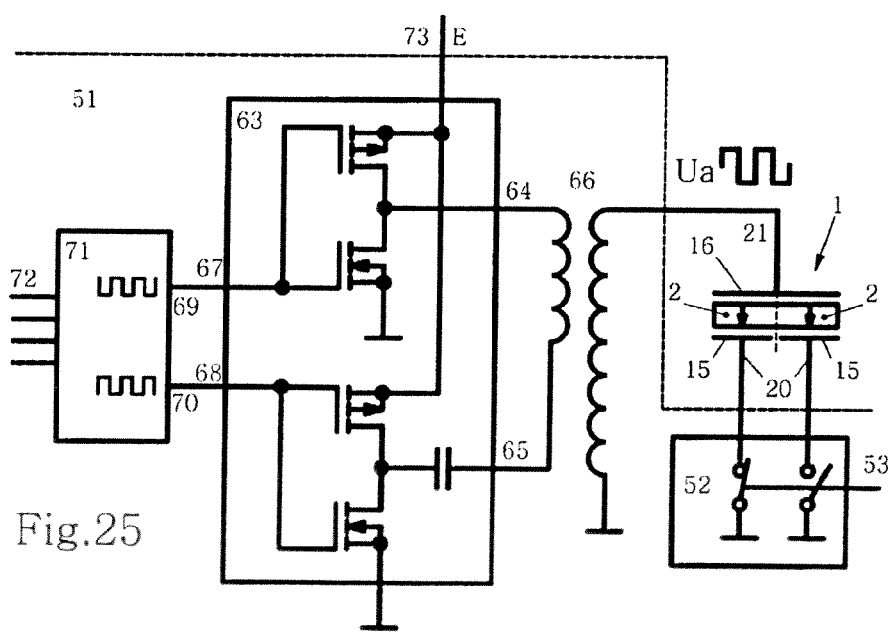
FIG. 25: a block diagram of a further embodiment of the electrical excitation device

The voltage $V_a$ can be applied to the electrode 15, 16 of the standing wave generator 2 of the actuator 1 directly, as shown in FIG. 24, 25, 28, 29.

It is possible for the electrical excitation device 51, 74 to contain a feedback element 86. An electrical voltage $V_s$, whose phase of the first harmonic, relative to the phase of the voltage $V_a$, reflects the position of the frequency $F_o$, is provided at the output 87 of the feedback element 86.

Because in practice the voltage $V_s$ does not always have a sinusoidal shape, the electrical excitation device 51, 74 can contain a filter for the first harmonic 97, whereby this filter is connected to the output of the feedback element 86. The non-sinusoidal voltage $V_s$ is applied to the input of the filter 97 and a sinusoidal voltage with the same frequency as the voltage $V_s$ appears at its output.

Figure 32:
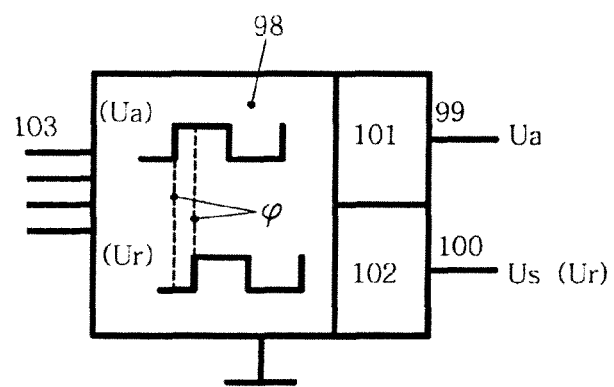
FIG. 32: a block diagram for the explanation of the provision of a phase detector

To determine the phase difference between the voltages $V_a$ and $V_s$, the electrical excitation device can contain a phase detector 98 (see FIG. 32, 33). The phase detector 98 supplies an analogue or digital signal at its output 103, whereby this signal reflects the phase difference between the voltage $V_a$ and $V_s$. This signal reaches the control input 72 of the generator 71, 85. The signal causes the frequency of the voltage provided by the generator 71, 85 always to be equal to the frequency $F_o$ ($F_a$). This makes it possible to stabilise the motor operation in a wide range of temperatures.

The electrical energy device 51, 74 can be equipped with a PWM controller 107 of the supply voltage E of the power amplifier, see FIG. 34. When an analogue or digital signal is applied to the input 110 of the PWM modulator 108, the voltage E appearing at the input 73 of the power amplifier 63 changes. This results in a change in the amplitude of the voltage $V_a$. This leads to a change in the exciting level of the actuator 1, as a result of which the speed of movement of the element 5 to be driven changes.

The function of the filter 97, 106, of the phase detector 98, of the control generator 71, 85 and of the PWM modulator 108 can be implemented by means of programs stored in the digital arithmetic unit 113.

The element 5 to be driven can be equipped with a position or speed encoder 114. Moreover, the electrical excitation device 51, 74 can be equipped with a digital controller 115 for the position or the speed of the element 5 to be driven (see FIG. 35). The controller 115 can be implemented as a separate digital unit or as a program portion in the digital arithmetic unit.

In the case of a motor whose excitation device contains the encoder 114 and the controller 115, it is possible to position the element 5 to be driven with a high level of precision or to stipulate its speed with a high level of accuracy.

The actuator 1 according to the invention is executed such that only the region 23 of the actuator 1 executes a resonant movement. The remaining area of the actuator 1 does not execute any resonant movement. This means that the average oscillation amplitude of the material points of the region 23 are greater than the average oscillation amplitude of the other regions of the actuator 1. The mechanical losses due to internal friction in this region of the actuator 1 are therefore less than those in the region 23. The actuator 1 of the motor executed according to the invention furthermore has, at the same resonant length L, a lower volume than the actuators of the known motor according to the publication DE 10 2004 024 656 A1. This moreover reduces the mechanical losses in the actuator 1. On this basis, the general mechanical losses due to internal friction in the actuator 1 are less than the losses due to internal friction in actuators of other known motors.

The reduction of the internal frictional losses makes it possible to increase, at the same excitation voltage, the oscillation speed of the friction element 3, i.e., the speed of movement of an element 5 to be driven. As a result, the degree of efficiency of a corresponding motor increases. Because the second lateral surface area 12 represents a non-resonant surface, the oscillation speed of the material points of this surface is less than that of the material points on the actuator surface of known motors. As a result, the mechanical losses due to external friction in the attachment elements 9 of the actuator 1 when used in a corresponding motor are decreased. Due to the reduction of the losses due to internal friction, the heating of the actuator 1 and a corresponding motor is also reduced. The lower losses due to internal and external friction also bring about a reduction in the active components of the electrical input impedance of the actuator 1 according to the invention in proportion to the capacitive component of this impedance. This in turn reduces the charging current of the input capacity of the actuator 1 and of the capacitive current in proportion to the active component of the current flowing through the actuator 1. Both lead to lower losses in a power amplifier, as a result of which the heating of the transistors in the power amplifier is reduced. In the actuator executed according to the invention, it is possible to connect the generators of the acoustic wave directly to the bridge power amplifier (without a separating filter). This simplifies the construction of the electrical excitation device, reduces the heating of the same and increases the operational reliability of the actuator. As a result, the application area is expanded.

The invention claimed is:

1. Actuator in the form of a plate, comprising:
   at least two generators for exciting an acoustic standing wave in the actuator, wherein the actuator has at least two main surfaces and a plane of symmetry S running perpendicularly to the main surfaces, with respect to which plane of symmetry S the generators are arranged symmetrically;
   arranged on a first substantially flat lateral surface area of the actuator, at least one friction element and/or at least one friction layer which are provided for friction contact with an element to be driven, and wherein the first lateral surface area has a length L that substantially corresponds to the wavelength of the acoustic standing wave excited in the actuator;
   a second lateral surface area of the actuator having a length B that is greater than a wavelength of the acoustic standing wave excited in the actuator and that is not equal to a multiple of half the wavelength of the excited acoustic standing wave; and
   an element to be driven and an electrical excitation device, wherein the electrical excitation device is configured to provide a periodic asymmetrical electrical voltage, wherein the generators are connected to each other with inverse phases.

2. Actuator according to claim 1, wherein the second lateral surface area is curved at least in sections.

3. Actuator according to claim 1, wherein the second lateral surface area is flat at least in sections.

4. Actuator according to claim 1, comprising:
   at least one point on the second lateral surface area, wherein a distance between this point and an intersection point of the plane of symmetry S with the first lateral surface area substantially corresponds to half the wavelength of the wave excited in the actuator.

5. Actuator according to claim 1, wherein the friction element and/or the friction layer is/are arranged symmetrically with respect to the plane of symmetry S and is/are arranged along the entire first lateral surface area.

6. Actuator according to claim 1, comprising;
   a configuration to perform oscillations in an ultrasound range during operation.

7. Actuator according to claim 1, comprising:
   a single layer or multiple layers, wherein the layer/layers has/have a piezoelectric material.

8. Motor according to claim 1, comprising:
   four actuators, each in the form of an isosceles trapezium, wherein these are arranged such that they form a Maltese cross.

9. Motor according to claim 8, wherein the actuators are connected to one another with a connection element, wherein the connection element has contact with the second lateral surface area of each actuator at least in sections.

10. Motor according to claim 9, wherein the connection element comprises:
    a sound-insulating material, and wherein the sound-insulating material is an oxide ceramic or is made of the same material as the actuator.

11. Motor according to claim 1, wherein the actuator comprises:
    a feedback element.

12. Motor according to claim 1, wherein the element to be driven comprises:
    an encoder for position or for speed of movement of the element to be driven, and the electrical excitation device is equipped with a digital controller for the position or the speed of movement of the element to be driven.

13. Motor according to claim 12, wherein the digital controller for the position or the speed of movement of the element to be driven is software stored in a digital arithmetic unit.

14. Actuator according to claim 2, wherein the second lateral surface comprises:
    at least one concave and/or at least one convex section.

15. Actuator according to claim 3, wherein the second lateral surface comprises:
    two or more flat sections that are aligned differently with respect to the first lateral surface area.

16. Actuator according to claim 7, wherein the piezoelectric material is a piezoceramic material.

17. Motor according to claim 10, wherein the connection element is made entirely of the sound-insulating material.

18. Motor according to claim 10, wherein the actuator comprises:
    a feedback element.

19. Actuator in the form of a plate, comprising:
    at least two generators for exciting an acoustic standing wave in the actuator, wherein the actuator has at least two main surfaces and a plane of symmetry S running perpendicularly to the main surfaces, with respect to which plane of symmetry S the generators are arranged symmetrically;
    arranged on a first substantially flat lateral surface area of the actuator, at least one friction element and/or at least one friction layer which are provided for friction contact with an element to be driven, and wherein the first lateral surface area has a length L that substantially corresponds to the wavelength of the acoustic standing wave excited in the actuator;
    a second lateral surface area of the actuator having a length B that is greater than a wavelength of the acoustic standing wave excited in the actuator and that is not equal to a multiple of half the wavelength of the excited acoustic standing wave; and an element to be driven and an electrical excitation device, wherein the element to be driven comprises:

an encoder for position or for speed of movement of the element to be driven, and the electrical excitation device is equipped with a digital controller for the position or the speed of movement of the element to be driven.

* * * * *